(12) United States Patent
Chen et al.

(10) Patent No.: US 12,183,428 B2
(45) Date of Patent: Dec. 31, 2024

(54) MEMORY CIRCUIT AND METHOD OF OPERATING THE SAME

(71) Applicants: TAIWAN SEMICONDUCTOR MANUFACTURING COMPANY, LTD., Hsinchu (TW); TSMC CHINA COMPANY, LIMITED, Songjiang (CN)

(72) Inventors: Yi-Tzu Chen, Hsinchu (TW); Ching-Wei Wu, Hsinchu (TW); Hau-Tai Shieh, Hsinchu (TW); Hung-Jen Liao, Hsinchu (TW); Fu-An Wu, Hsinchu (TW); He-Zhou Wan, Hsinchu (TW); XiuLi Yang, Hsinchu (TW)

(73) Assignees: TAIWAN SEMICONDUCTOR MANUFACTURING COMPANY, LTD., Hsinchu (TW); TSMC CHINA COMPANY, LIMITED, Shanghai (CN)

(*) Notice: Subject to any disclaimer, the term of this patent is extended or adjusted under 35 U.S.C. 154(b) by 0 days.

(21) Appl. No.: 18/358,177

(22) Filed: Jul. 25, 2023

(65) Prior Publication Data
US 2023/0368826 A1 Nov. 16, 2023

Related U.S. Application Data

(63) Continuation of application No. 17/816,090, filed on Jul. 29, 2022, now Pat. No. 11,715,505, which is a (Continued)

(30) Foreign Application Priority Data
Feb. 26, 2021 (CN) .......................... 202110218704.6

(51) Int. Cl.
G11C 7/12 (2006.01)
G11C 7/10 (2006.01)
(Continued)

(52) U.S. Cl.
CPC ............ G11C 7/222 (2013.01); G11C 7/1048 (2013.01); G11C 7/106 (2013.01); G11C 7/1087 (2013.01); G11C 7/12 (2013.01); G11C 7/14 (2013.01)

(58) Field of Classification Search
CPC ....... G11C 7/222; G11C 7/1048; G11C 7/106; G11C 7/1087; G11C 7/12; G11C 7/14;
(Continued)

(56) References Cited

U.S. PATENT DOCUMENTS 7,158,432 B1 1/2007 Hunter et al.
9,208,857 B2 12/2015 Chen et al.
(Continued)

FOREIGN PATENT DOCUMENTS

KR 20190111565 10/2019
TW 202101452 1/2021

OTHER PUBLICATIONS

Office Action dated Dec. 8, 2021 for corresponding case No. DE 10 2021 110 222.7, p. 1.
(Continued)

Primary Examiner — Xiaochun L Chen
(74) Attorney, Agent, or Firm — Hauptman Ham, LLP

(57) ABSTRACT

A memory circuit includes a NAND logic gate configured to receive a first bit line signal and a second bit line signal, and to generate a first signal. The memory circuit further includes a first P-type transistor coupled to the NAND logic gate, and configured to receive a first clock signal. The memory circuit further includes a first N-type transistor coupled to the NAND logic gate, and configured to receive
(Continued)

a first pre-charge signal. The memory circuit further includes a first latch coupled to the NAND logic gate, and configured to latch the first signal in response to at least the first clock signal or the first pre-charge signal.

20 Claims, 14 Drawing Sheets

Related U.S. Application Data continuation of application No. 17/235,297, filed on Apr. 20, 2021, now Pat. No. 11,468,929.

(51) Int. Cl.
*G11C 7/14* (2006.01)
*G11C 7/22* (2006.01)

(58) Field of Classification Search
CPC ......... G11C 16/24; G11C 5/147; G11C 16/30; H03K 19/0952
See application file for complete search history.

(56) References Cited

U.S. PATENT DOCUMENTS

| | | |
|---|---|---|
| 9,697,890 B1 | 7/2017 | Wang |
| 9,711,229 B1 | 7/2017 | Rabkin et al. |
| 11,621,258 B2 * | 4/2023 | Lu .......................... G11C 11/412 |
| | | 365/156 |
| 2005/0040873 A1 | 2/2005 | Wada et al. |
| 2009/0080275 A1 | 3/2009 | Vo et al. |
| 2010/0213981 A1 | 8/2010 | Kim |
| 2011/0273945 A1 | 11/2011 | Donkoh |
| 2012/0327734 A1 | 12/2012 | Sato |
| 2014/0321217 A1 | 10/2014 | Song et al. |
| 2015/0162076 A1 | 6/2015 | Wang |
| 2015/0213858 A1 | 7/2015 | Tao et al. |

OTHER PUBLICATIONS

Notice of Allowance dated Jul. 18, 2022 from corresponding application No. TW 110135860.

* cited by examiner

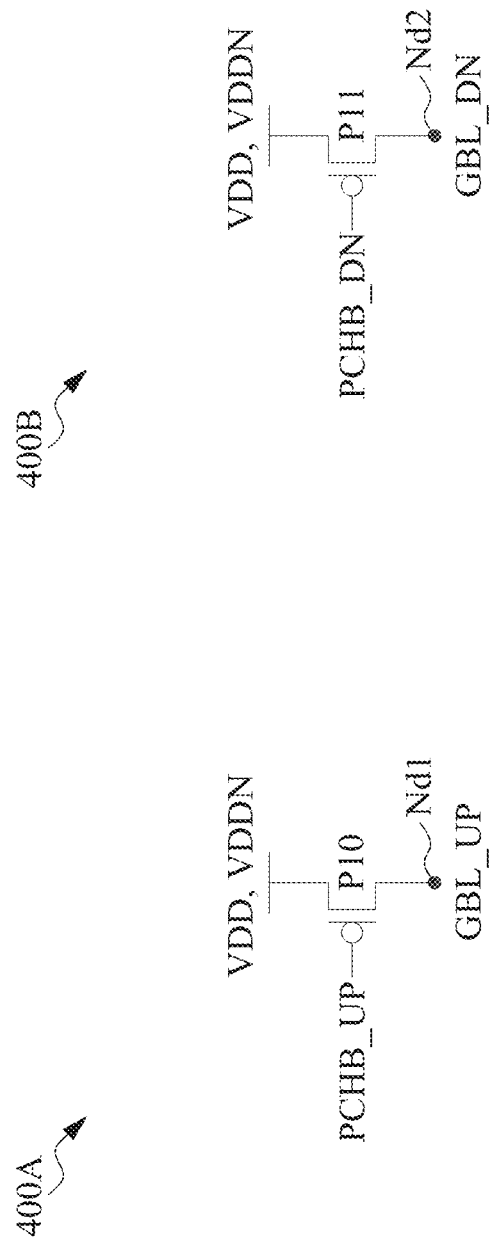

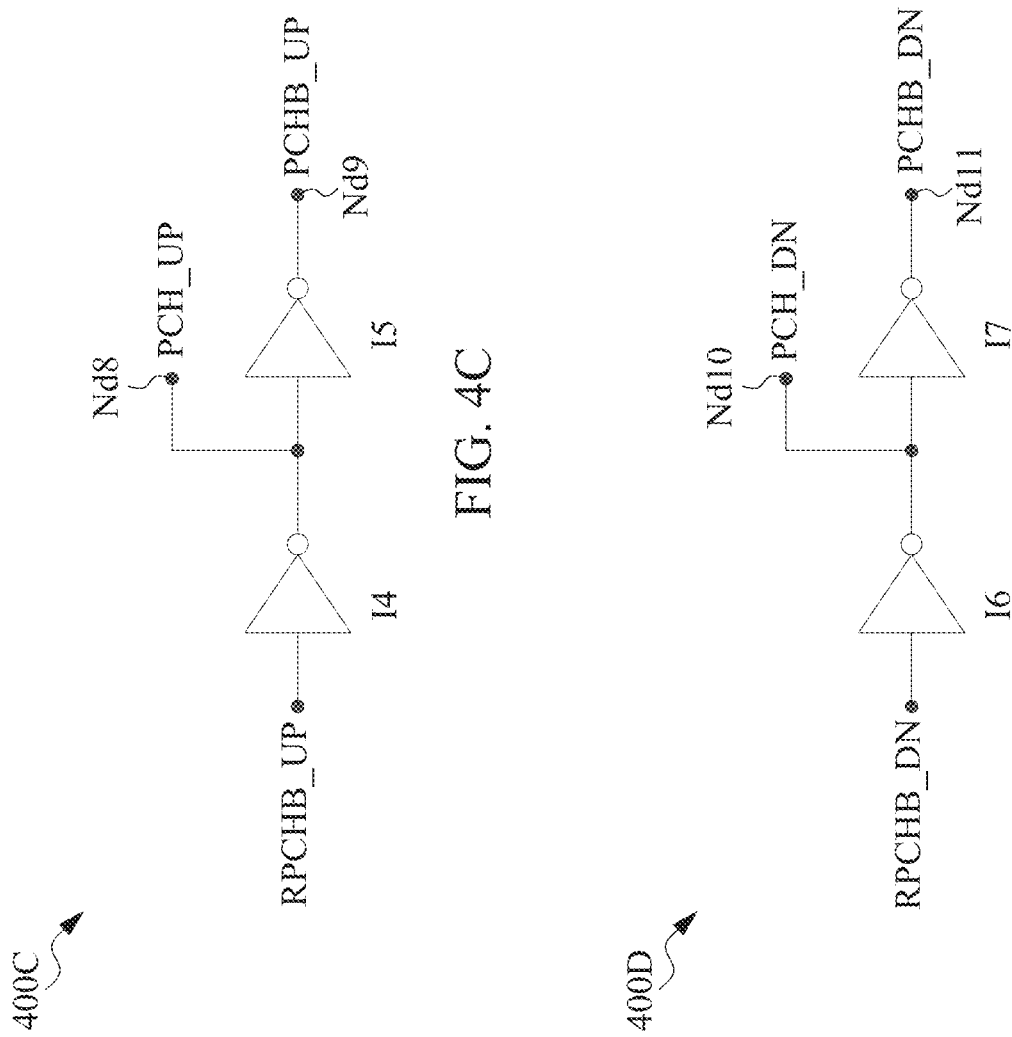

MEMORY CIRCUIT AND METHOD OF OPERATING THE SAME

PRIORITY CLAIM

The present application is a continuation of U.S. application Ser. No. 17/816,090, filed Jul. 29, 2022, now U.S. Pat. No. 11,715,505, issued Aug. 1, 2023, which is a continuation of U.S. application Ser. No. 17/235,297, filed Apr. 20, 2021, now U.S. Pat. No. 11,468,929, issued Oct. 11, 2022, which claims the benefit of China Application No. 202110218704.6, filed Feb. 26, 2021, which are herein incorporated by reference in their entireties.

BACKGROUND

The semiconductor integrated circuit (IC) industry has produced a wide variety of digital devices to address issues in a number of different areas. Some of these digital devices, such as memory macros, are configured for the storage of data. As ICs have become smaller and more complex, the resistance of conductive lines within these digital devices are also changed affecting the operating voltages of these digital devices and overall IC performance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 4A is a circuit diagram of a pull-up circuit, in accordance with some embodiments.

FIG. 4B is a circuit diagram of a pull-up circuit, in accordance with some embodiments.

FIG. 4C is a circuit diagram of a circuit, in accordance with some embodiments.

FIG. 4D is a circuit diagram of a circuit, in accordance with some embodiments.

DETAILED DESCRIPTION

Figure 1:
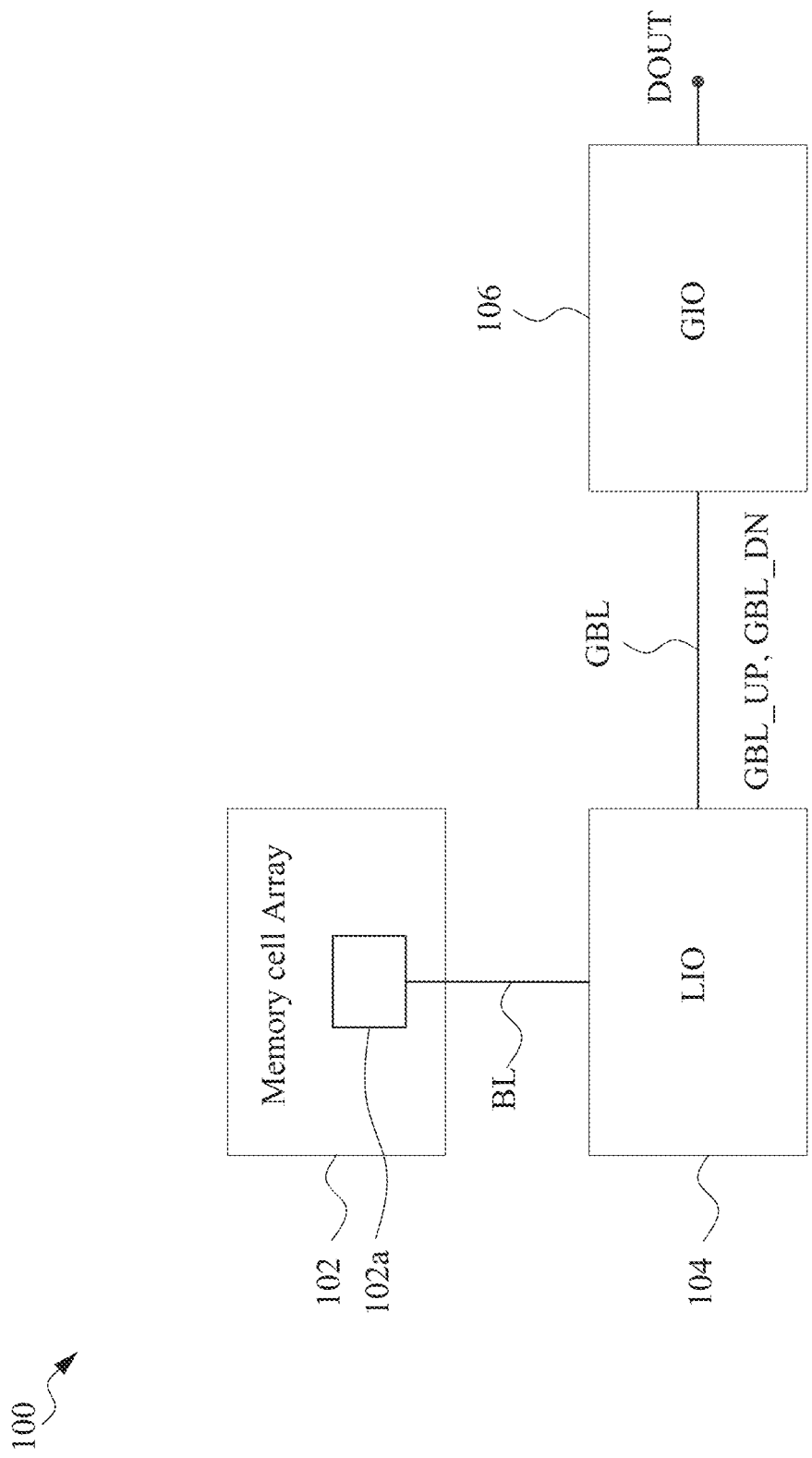
FIG. 1 is a circuit diagram of a memory circuit, in accordance with some embodiments.

The following disclosure provides different embodiments, or examples, for implementing features of the provided subject matter. Specific examples of components, materials, values, steps, arrangements, or the like, are described below to simplify the present disclosure. These are, of course, merely examples and are not limiting. Other components, materials, values, steps, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, a memory circuit includes a NAND logic gate, a first N-type transistor, a second N-type transistor, a first inverter and a first latch. The NAND logic gate is configured to receive a first bit line signal and a second bit line signal, and is configured to generate a first signal.

The first N-type transistor is coupled to the NAND logic gate, and configured to receive a first pre-charge signal. The second N-type transistor is coupled to the first N-type transistor and a reference voltage supply, and configured to receive a first clock signal.

In some embodiments, the first inverter is coupled to the NAND logic gate, and configured to output a data signal inverted from the first signal. The first latch is coupled to the NAND logic gate, and configured to latch the first signal in response to at least the first clock signal or the first pre-charge signal.

In some embodiments, the first N-type transistor is coupled between the second N-type transistor and a first voltage supply node of the NAND logic gate. In some embodiments, by including the first N-type transistor between the second N-type transistor and the first voltage supply node of the NAND logic gate, the first N-type transistor can be disabled thereby causing NAND logic gate circuit to be disabled in response to the first pre-charge signal. In some embodiments, by causing NAND logic gate circuit to be disabled in response to the first pre-charge signal, the memory circuit reduces the number of toggling transistors thereby reducing power consumption compared with other approaches.

Memory Circuit

FIG. 1 is a circuit diagram of a memory circuit 100, in accordance with some embodiments. In the embodiment of FIG. 1, integrated circuit 100 is a memory macro.

Memory circuit 100 includes a memory cell array 102, a local input output (LIO) circuit 104, and a global input output (GIO) circuit 106. Memory cell array 102 is coupled to LIO circuit 104 by bit lines BL. LIO circuit 104 is coupled to GIO circuit 106 by global bit lines GBL.

Memory cell array 102 comprises an array of memory cells having N rows and M columns, where M and N are positive integers. Memory cell array 102 is shown with a single memory cell 102a for brevity and ease of illustration. In some embodiments, each memory cell in memory cell array 102 is configured to store a corresponding bit of data.

The rows of cells in memory cell array 102 are arranged in a first direction X (not shown). The columns of cells in memory cell array 102 are arranged in a second direction Y (not shown). The second direction Y is different from the first direction X. In some embodiments, the second direction Y is perpendicular to the first direction X.

Memory cell array 102 further includes N word lines (not shown for ease of illustration) coupled to a corresponding row of memory cells in memory cell array 102. Each row in memory cell array 102 is associated with a corresponding word line. Each word line WL extends in the first direction X (not shown).

Memory cell array 102 further includes M bit lines coupled to a corresponding column of memory cells in memory cell array 102. Each column in memory cell array 102 is associated with a corresponding bit line. Each bit line BL extends in the second direction Y (not shown).

Each memory cell in memory cell array 102 is coupled with a corresponding bit line BL. In some embodiments, memory cell array 102 is a single-ended memory, and therefore each memory cell in memory cell array 102 is coupled with a corresponding bit line BL.

In some embodiments, memory cell array 102 is a dual-ended memory and therefore each memory cell in memory cell array 102 is coupled with a corresponding pair of bit lines BL. The bit lines are configured to carry bit line signals (not shown).

In some embodiments, memory cell array 102 is a non-volatile random-access memory (NVRAM) array. In some embodiments, each memory cell in memory cell array 102 corresponds to a static random access memory (SRAM) cell. Different types of memory cells in memory cell array 102 are within the contemplated scope of the present disclosure. For example, in some embodiments, each memory cell in memory cell array 102 is a magneto-resistive random-access memory (MRAM). In some embodiments, each memory cell in memory cell array 102 corresponds to a resistive random-access memory (RRAM) cell. In some embodiments, each memory cell in memory cell array 102 corresponds to a dynamic random-access memory (DRAM) cell. In some embodiments, each memory cell in memory cell array 102 corresponds to a one-time programmable (OTP) memory cell. In some embodiments, memory cell array 102 corresponds to flash memory. Other configurations of memory cell array 102 are within the scope of the present disclosure.

LIO circuit 104 is configured to receive bit line signals (not shown) on corresponding bit lines from the memory cell array 102. In some embodiments, LIO circuit 104 includes sense amplifiers (not shown) where bit line signals from the memory cell array 102 are amplified, and then output by the LIO circuit 104 to the GIO circuit 106 as global bit line signals GBL_UP and GBL_DN. In some embodiments, at least global bit line signal GBL_UP or GBL_DN corresponds to read data stored in the memory cell array 102. In some embodiments, memory cell array 102 is divided into an upper portion, and a lower portion, and global bit line signal GBL_UP corresponds to read data stored in the upper portion of memory cell array 102, and global bit line signal GBL_DN corresponds to read data stored in the lower portion of memory cell array 102. Other configurations of LIO circuit 104 are within the scope of the present disclosure.

GIO circuit 106 receives the global bit line signals GBL_UP and GBL_DN on global bit lines GBL from LIO circuit 104. GIO circuit 106 is configured to output a data signal DOUT in response to at least global bit line signals GBL_UP and GBL_DN. Data signal DOUT corresponds to data stored in the memory cell array 102. In some embodiments, data signal DOUT corresponds to at least global bit line signal GBL_UP or GBL_DN.

In some embodiments, LIO circuit 104 and GIO circuit 106 are combined into a single 10 circuit. In some embodiments, at least LIO circuit 104 or GIO circuit 106 includes a latch circuit (not shown) configured to latch the data stored in the memory cell array 102. Other configurations of GIO circuit 106 are within the scope of the present disclosure.

Other configurations of memory circuit 100 are within the scope of the present disclosure.

Figure 2:
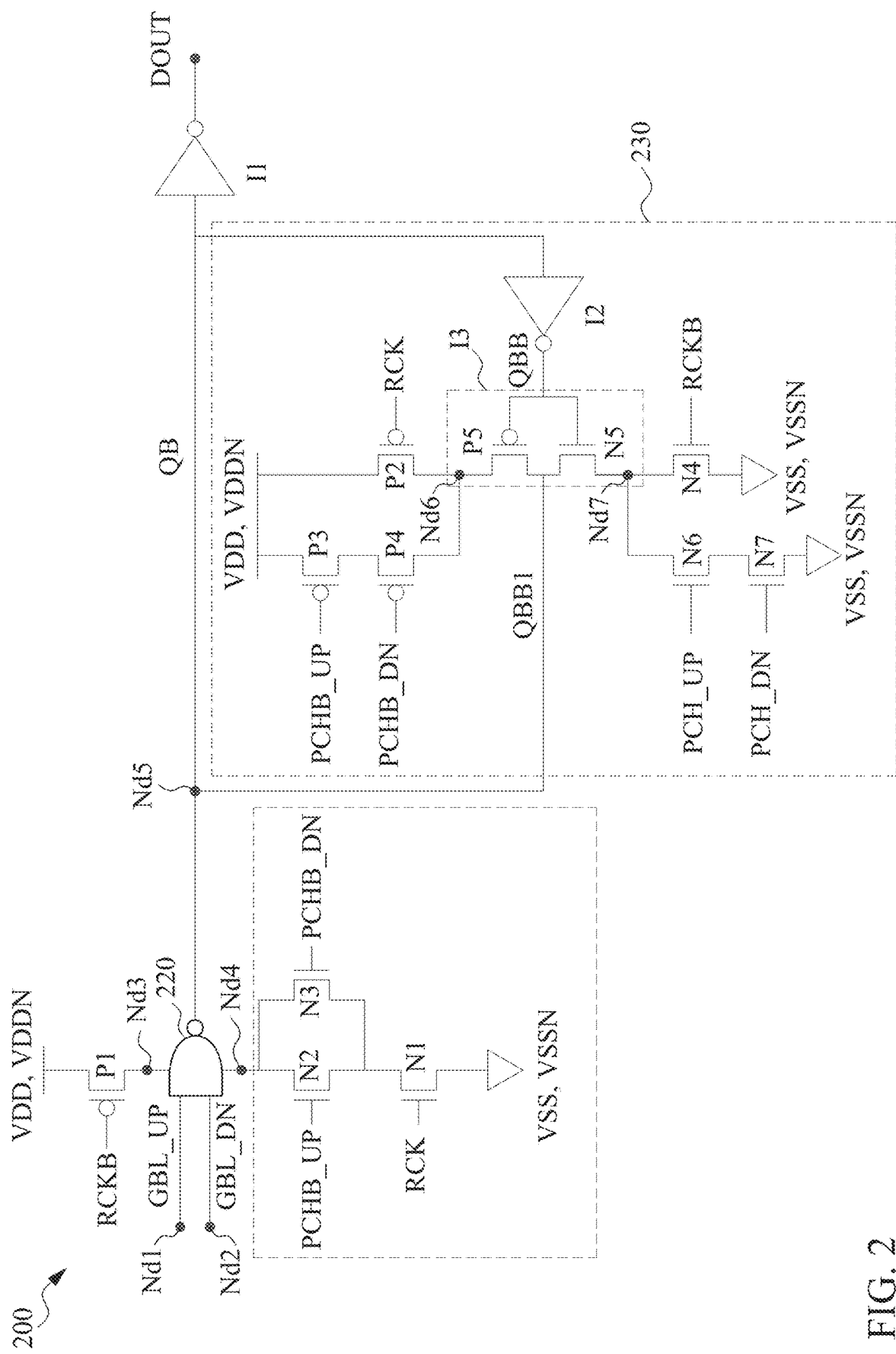
FIG. 2 is a circuit diagram of a circuit, in accordance with some embodiments.

FIG. 2 is a circuit diagram of a circuit 200, in accordance with some embodiments.

Circuit 200 is an embodiment of GIO circuit 106 of FIG. 1 and similar detailed description is therefore omitted. In some embodiments, circuit 200 is a read-out circuit configured to read data stored in memory cell array 102.

Circuit 200 includes a NAND logic gate 220, N-type Metal Oxide Semiconductor (NMOS) transistors N1, N2, N3, N4, N5, N6 and N7, P-type Metal Oxide Semiconductor PMOS) transistors P1, P2, P3, P4 and P5, and inverters I1 and I2.

A first input terminal Nd1 of NAND logic gate 220 is configured to receive global bit line signal GBL_UP. In some embodiments, the first input terminal Nd1 of NAND logic gate 220 is directly coupled to pull-up circuit 400A of FIG. 4A. A second input terminal Nd2 of NAND logic gate 220 is configured to receive global bit line signal GBL_DN. In some embodiments, the second input terminal Nd2 of NAND logic gate 220 is directly coupled to pull-up circuit 400B of FIG. 4B.

An output terminal of NAND logic gate 220 is configured to output a signal QB. NAND logic gate 220 is configured to generate signal QB based on global bit line signal GBL_UP and global bit line signal GBL_DN. An output terminal of NAND logic gate 220 is coupled to at least a node Nd5.

NAND logic gate 220 has a first voltage supply node Nd3 and a second voltage supply node Nd4. In some embodiments, the first voltage supply node Nd3 of NAND logic gate 220 is configured to receive a supply voltage VDD. In some embodiments, the second voltage supply node Nd4 of NAND logic gate 220 is configured to receive a reference supply voltage VSS. In some embodiments, the reference supply voltage VSS is different from the supply voltage VDD.

A gate terminal of PMOS transistor P1 is configured to receive a clock signal RCKB. In some embodiments, at least clock signal RCKB or RCK (described below) is a read clock signal configured to cause circuit 200 to read data stored in memory cell array 102. A source terminal of PMOS transistor P1 is coupled to a voltage supply node VDDN. Voltage supply node VDDN has the supply voltage VDD. A drain terminal of PMOS transistor P1 is coupled to the first voltage supply node Nd3 of NAND logic gate 220.

In some embodiments, if PMOS transistor P1 is turned off in response to clock signal RCKB, then the first voltage supply node Nd3 of NAND logic gate 220 is electrically floating. In some embodiments, if PMOS transistor P1 is turned on in response to clock signal RCKB, then the first voltage supply node Nd3 of NAND logic gate 220 is coupled to the supply voltage node VDDN, and receives supply voltage VDD.

A gate terminal of NMOS transistor N1 is configured to receive a clock signal RCK. In some embodiments, clock signal RCK is inverted from clock signal RCKB and vice versa. A source terminal of NMOS transistor N1 is coupled to a reference voltage supply node VSSN. Reference voltage supply node VSSN has the reference supply voltage VSS.

Each of a drain terminal of NMOS transistor N1, a source terminal of NMOS transistor N2, and a source terminal of NMOS transistor N3 are coupled together.

A gate terminal of NMOS transistor N2 is configured to receive a pre-charge signal PCHB_UP. A gate terminal of NMOS transistor N3 is configured to receive a pre-charge signal PCHB_DN. Each of a drain terminal of NMOS transistor N2, a drain terminal of NMOS transistor N3 are coupled together, and are further coupled to the second voltage supply node Nd4 of NAND logic gate 220.

In some embodiments, if NMOS transistor N1 is turned off in response to clock signal RCKB, then the second voltage supply node Nd4 of NAND logic gate 220 is electrically floating. In some embodiments, if NMOS transistor N2 and N3 are turned off in response to corresponding pre-charge signals PCHB_UP and PCHB_DN, then the second voltage supply node Nd4 of NAND logic gate 220 is electrically floating.

In some embodiments, if NMOS transistor N1 is turned on in response to clock signal RCK, and at least one of NMOS transistor N2 or N3 is turned on in response to corresponding pre-charge signal PCHB_UP or PCHB_DN, then the second voltage supply node Nd4 of NAND logic gate 220 is coupled to the reference supply voltage VSSN, and receives reference supply voltage VSS.

Each of an input terminal of inverter I1, node Nd5, an output terminal of NAND logic gate 220, an input terminal of inverter I2, a drain of NMOS transistor N5 and a drain of PMOS transistor P5 are coupled together. The input terminal of inverter I1 is configured to receive signal QB from at least node Nd5. In some embodiments, the input terminal of inverter I1 is configured to receive signal QB from NAND logic gate 220. In some embodiments, the input terminal of inverter I1 is configured to receive signal QB from the drain of NMOS transistor N5 and the drain of PMOS transistor P5.

An output terminal of inverter I1 is configured to output an output data signal DOUT. In some embodiments, the output data signal DOUT corresponds to an output signal from memory cell array 102 of FIG. 1. In some embodiments, output data signal DOUT is inverted from signal QB and vice versa.

An input terminal of inverter I2 is configured to receive signal QB from at least node Nd5. In some embodiments, the input terminal of inverter I2 is configured to receive signal QB from NAND logic gate 220. In some embodiments, the input terminal of inverter I2 is configured to receive signal QB from the drain of NMOS transistor N5 and the drain of PMOS transistor P5.

An output terminal of inverter I2 is configured to output a signal QBB. In some embodiments, signal QBB is inverted from signal QB and vice versa. The output terminal of inverter I2 is coupled to a gate of NMOS transistor N5 and a gate of PMOS transistor P5.

A gate terminal of PMOS transistor P2 is configured to receive the clock signal RCK. A source terminal of PMOS transistor P2 is coupled to the voltage supply node VDDN.

Each of a drain terminal of PMOS transistor P2, a drain terminal of PMOS transistor P4, and a source terminal of PMOS transistor P5 are coupled together.

A gate terminal of PMOS transistor P3 is configured to receive the pre-charge signal PCHB_UP. A source terminal of PMOS transistor P3 is coupled to the voltage supply node VDDN. In some embodiments, the source terminal of PMOS transistor P3 and the source terminal of PMOS transistor P2 are coupled together.

A drain terminal of PMOS transistor P3 and a source terminal of PMOS transistor P4 are coupled together. A gate terminal of PMOS transistor P4 is configured to receive the pre-charge signal PCHB_DN.

Each of a gate terminal of PMOS transistor P5, a gate terminal of NMOS transistor N5 and the output terminal of inverter I2 are coupled together. The gate terminal of PMOS transistor P5 is configured to receive the signal QBB. The gate terminal of NMOS transistor N5 is configured to receive the signal QBB. The drain terminal of PMOS transistor P5 and the drain terminal of NMOS transistor N5 are coupled together.

The drain terminal of PMOS transistor P5 or the drain terminal of NMOS transistor N5 is configured to output a signal QBB1. In some embodiments, signal QBB1 is a latched version of signal QB. In some embodiments, signal QBB1 is inverted from signal QBB and vice versa. In some embodiments, signal QBB1 corresponds to a feedback signal fed back to node Nd5.

A gate terminal of NMOS transistor N4 is configured to receive the clock signal RCKB. A source terminal of NMOS transistor N4 is coupled to the reference voltage supply node VSSN.

Each of a drain terminal of NMOS transistor N4, a drain terminal of NMOS transistor N6, and a source terminal of NMOS transistor N5 are coupled together.

A gate terminal of NMOS transistor N6 is configured to receive the pre-charge signal PCHB_UP. A source terminal of NMOS transistor N6 and a drain terminal of NMOS transistor N7 are coupled together.

A gate terminal of NMOS transistor N7 is configured to receive the pre-charge signal PCHB_DN. A source terminal of NMOS transistor N7 is coupled to the reference voltage supply node VSSN. In some embodiments, the source terminal of NMOS transistor N7 and the source terminal of NMOS transistor N4 are coupled together.

In some embodiments, PMOS transistor P5 and NMOS transistor N5 form an inverter I3. In some embodiments, inverter I3 and PMOS transistor P2 and NMOS transistor N4 form a tristate inverter (not labelled).

In some embodiments, inverter I3 is enabled when inverter I3 is coupled to voltage supply node VDDN and reference supply node VSSN. In some embodiments, inverter I3 is disabled when inverter I3 is decoupled from voltage supply node VDDN and reference supply node VSSN. The source terminal of PMOS transistor P5 has a voltage supply node Nd6, and the source terminal of NMOS transistor N5 has a voltage supply node Nd7. For example, in some embodiments, the voltage supply node Nd6 of PMOS transistor P5 is coupled to supply voltage node VDDN, and is configured to receive a supply voltage VDD, and the voltage supply node Nd7 of NMOS transistor N5 is coupled to reference supply voltage node VSSN, and is configured to receive a reference supply voltage VSS, thus inverter I3 is enabled. For example, in some embodiments, the voltage supply node Nd6 of PMOS transistor P5 is not coupled to supply voltage node VDDN, and the voltage supply node Nd7 of NMOS transistor N5 is not coupled to reference supply voltage node VSSN, thus inverter I3 is disabled.

In some embodiments, when inverter I3 is enabled or disabled, then a latch 230 is enabled or disabled, respectively. In some embodiments, when inverter I3 is enabled, then inverter I2 and I3 are inverters coupled in series and thus function as a latch 230 configured to latch the state of signal QB.

Latch 230 is configured to maintain the state of node Nd5 and signal QB and data signal DOUT when latch 230 is enabled. In some embodiments, latch 230 is enabled when NAND gate 220 is electrically floating or disabled, and vice versa.

In some embodiments, inverter I2, PMOS transistors P2 and P5 and NMOS transistors N4 and N5 form latch 230 configured to latch the state of signal QB. For example, in some embodiments, when signal RCK is logically high, then PMOS transistor P2 and NMOS transistor N4 turn on, and thus PMOS transistor P5 and NMOS transistor N5 function as inverter I3. In other words, inverter I3 is enabled. In these embodiments, signal RCK being logically high causes PMOS transistor P2 to turn on, and signal RCKB being logically low thereby causes NMOS transistor N4 to turn on. In response to PMOS transistor P2 and NMOS transistor N4 turning on, corresponding voltage supply nodes Nd6 and Nd7 are electrically coupled to corresponding supply voltage node VDDN and reference supply voltage node VSSN. Thus, in these embodiments, inverter I2, PMOS transistors P2 and P5 and NMOS transistors N4 and N5 thereby latch the state of signal QB.

In some embodiments, inverter I2, PMOS transistors P3, P4 and P5 and NMOS transistors N5, N6 and N7 form a latch 230 configured to latch the state of signal QB. For example, in some embodiments, when pre-charge signal PCHB_UP and pre-charge signal PCHB_DN are both logically low, then corresponding PMOS transistors P3 and P4 and corresponding NMOS transistors N6 and N7 turn on, and thus PMOS transistor P5 and NMOS transistor N5 function as inverter I3. In other words, inverter I3 is enabled. In these embodiments, pre-charge signal PCHB_UP being logically low causes PMOS transistor P3 to turn on, and also causes pre-charge signal PCH_UP to be logically high thereby causing NMOS transistor N6 to turn on, and pre-charge signal PCHB_DN being logically low causes PMOS transistor P4 to turn on, and also causes pre-charge signal PCH_DN to be logically high thereby causing NMOS transistor N7 to turn on. In response to PMOS transistors P3 and P4 and NMOS transistors N6 and N7 turning on, corresponding voltage supply nodes Nd6 and Nd7 are electrically coupled to corresponding supply voltage node VDDN and reference supply voltage node VSSN. Thus, in these embodiments, inverter I2, PMOS transistors P3, P4 and P5 and NMOS transistors N5, N6 and N7 thereby latch the state of signal QB.

Other configurations of transistors, number of transistors or transistor types of circuit 200 are within the scope of the present disclosure.

NAND Logic Gate Circuit

Figure 3:
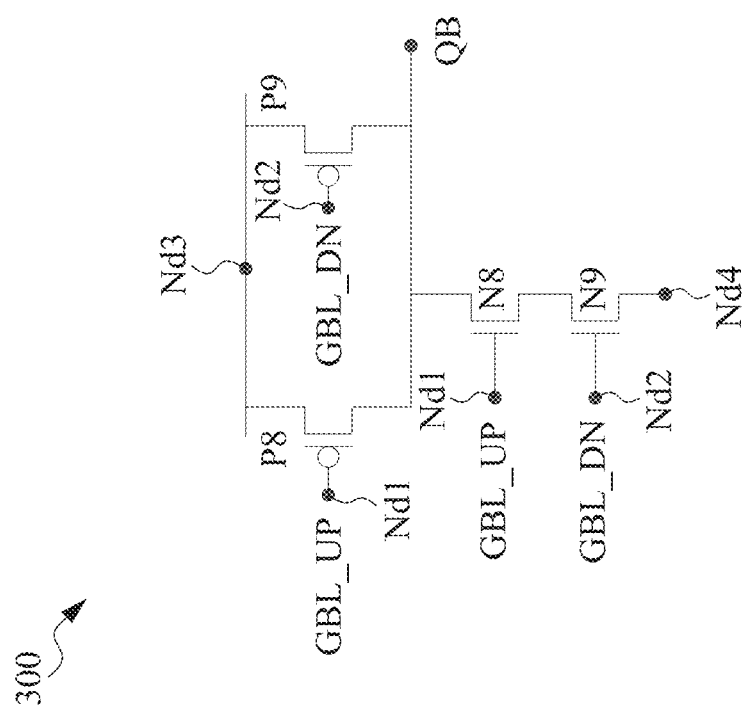
FIG. 3 is a circuit diagram of a NAND logic gate circuit, in accordance with some embodiments.

FIG. 3 is a circuit diagram of a NAND logic gate circuit 300, in accordance with some embodiments.

NAND logic gate circuit 300 is usable as NAND logic gate 220 of FIGS. 2 and 6-10.

NAND logic gate circuit 300 is an embodiment of NAND logic gate 220 of FIG. 2, and similar detailed description is therefore omitted.

NAND logic gate circuit 300 includes PMOS transistors P8 and P9 and NMOS transistors N8 and N9.

A gate terminal of PMOS transistor P8 is configured to receive the global bit line signal GBL_UP. A source terminal of PMOS transistor P8 is coupled to the first voltage supply node Nd3 of NAND logic gate 220 of FIG. 2.

A gate terminal of PMOS transistor P9 is configured to receive the global bit line signal GBL_DN. A source terminal of PMOS transistor P9 is coupled to the first voltage supply node Nd3 of NAND logic gate 220 of FIG. 2. In some embodiments, the source terminal of PMOS transistor P8 and the source terminal of PMOS transistor P9 are coupled together.

Each of a drain terminal of PMOS transistor P8, a drain terminal of PMOS transistor P9, a drain terminal of NMOS transistor N8 are coupled together.

A gate terminal of NMOS transistor N8 is configured to receive the global bit line signal GBL_UP. A source terminal of NMOS transistor N8 and a drain terminal of NMOS transistor N9 are coupled together.

A gate terminal of NMOS transistor N9 is configured to receive the global bit line signal GBL_DN. A source terminal of NMOS transistor N9 is coupled to the second voltage supply node Nd4.

Other configurations of transistors, number of transistors or transistor types of NAND logic gate circuit 300 are within the scope of the present disclosure.

Pull-Up Circuit

FIG. 4A is a circuit diagram of a pull-up circuit 400A, in accordance with some embodiments.

Pull-up circuit 400A is usable with integrated circuit 200 of FIG. 2 or NAND logic gate circuit 300 of FIG. 3, and similar detailed description is therefore omitted.

For example, in some embodiments, pull-up circuit 400A is usable with circuit 200 of FIG. 2 or circuit 600-1000 of corresponding FIGS. 6-10, and is coupled to the first input terminal (e.g., node Nd1) of NAND logic gate 220.

For example, in some embodiments, pull-up circuit 400A is usable with NAND logic gate circuit 300 of FIG. 3, and is coupled to the first input terminal (e.g., node Nd1) of NAND logic gate 220.

Pull-up circuit 400A is coupled to node Nd1. Pull-up circuit 400A is configured to receive pre-charge signal PCHB_UP. Pull-up circuit 400A is configured to pre-charge node Nd1 to a predetermined voltage level responsive to pre-charge signal PCHB_UP. In some embodiments, the predetermined voltage level corresponds to a logical value, such as a logical high value or a logical low value. In some embodiments, the predetermined voltage level corresponds to a value of supply voltage VDD, or reference supply voltage VSS. Other configurations of pull-up circuit 400A are within the scope of the present disclosure.

Pull-up circuit 400A includes a PMOS transistor P10. A gate terminal of PMOS transistor P10 is configured to receive the pre-charge signal PCHB_UP. A source terminal of PMOS transistor P10 is coupled to the voltage supply node VDDN. A drain terminal of PMOS transistor P10 is coupled to node Nd1. A voltage of node Nd1 corresponds to the global bit line signal GBL_UP. In some embodiments, PMOS transistor P4 is configured to pre-charge the global bit line signal GBL_UP at node Nd1 to the predetermined voltage level responsive to pre-charge signal PCHB_UP.

Other configurations of transistors, number of transistors or transistor types of PMOS transistor P10 are within the scope of the present disclosure.

FIG. 4B is a circuit diagram of a pull-up circuit 400B, in accordance with some embodiments.

Pull-up circuit 400B is usable with integrated circuit 200 of FIG. 2 or NAND logic gate circuit 300 of FIG. 3, and similar detailed description is therefore omitted.

For example, in some embodiments, pull-up circuit 400B is usable with circuit 200 of FIG. 2 or circuit 600-1000 of corresponding FIGS. 6-10, and is coupled to the second input terminal (e.g., node Nd2) of NAND logic gate 220.

For example, in some embodiments, pull-up circuit 400B is usable with NAND logic gate circuit 300 of FIG. 3, and is coupled to the second input terminal (e.g., node Nd2) of NAND logic gate 220.

Pull-up circuit 400B is coupled to node Nd2. Pull-up circuit 400B is configured to receive pre-charge signal PCHB_DN. Pull-up circuit 400B is configured to pre-charge node Nd2 to the predetermined voltage level responsive to pre-charge signal PCHB_DN. In some embodiments, the predetermined voltage level corresponds to a logical high value or a logical low value. Other configurations of pull-up circuit 400B are within the scope of the present disclosure.

Pull-up circuit 400B includes a PMOS transistor P11. A gate terminal of PMOS transistor P11 is configured to receive the pre-charge signal PCHB_DN. A source terminal of PMOS transistor P11 is coupled to the voltage supply node VDDN. A drain terminal of PMOS transistor P11 is coupled to node Nd2. A voltage of node Nd2 corresponds to the global bit line signal GBL_DN. In some embodiments, PMOS transistor P4 is configured to pre-charge the global bit line signal GBL_DN at node Nd2 to the predetermined voltage level responsive to pre-charge signal PCHB_DN.

Other configurations of transistors, number of transistors or transistor types of PMOS transistor P11 are within the scope of the present disclosure.

FIG. 4C is a circuit diagram of a circuit 400C, in accordance with some embodiments.

Circuit 400C is configured to generate the pre-charge signal PCH_UP and the pre-charge signal PCHB_UP.

Circuit 400C is usable with integrated circuit 200 of FIG. 2 or pull-up circuit 400A of FIG. 4A, and similar detailed description is therefore omitted.

For example, in some embodiments, circuit 400C is usable with circuit 200 of FIG. 2 or circuit 600-1000 of corresponding FIGS. 6-10, and is coupled to at least the gate of NMOS transistor N2, the gate of PMOS transistor P3 or the gate of NMOS transistor N6.

For example, in some embodiments, circuit 400C is usable with pull-up circuit 400A of FIG. 4A, and is coupled to the gate terminal of PMOS transistor P10.

Circuit 400C includes an inverter I4 and an inverter I5. In some embodiments, circuit 400C is configured to generate the pre-charge signal PCH_UP and the pre-charge signal PCHB_UP.

Inverter I4 is configured to generate the pre-charge signal PCH_UP in response to a pre-charge signal RPCHB_UP. An input terminal of inverter I4 is configured to receive the pre-charge signal RPCHB_UP. In some embodiments, pre-charge signal RPCHB_UP is received from an external circuit (not shown). In some embodiments, the input terminal of inverter I4 is coupled to the external circuit (not shown). An output terminal of inverter I4 is configured to output the pre-charge signal PCH_UP to at least an input terminal of inverter I5 or node Nd8. In some embodiments, pre-charge signal PCH_UP is inverted from pre-charge signal RPCHB_UP and vice versa. The output terminal of inverter I4 is coupled to at least an input terminal of inverter I5 or node Nd8.

In some embodiments, each of the output terminal of inverter I4, node Nd8 and the gate of NMOS transistor N6 are coupled together. In some embodiments, the gate of NMOS transistor N6 is configured to receive pre-charge signal PCH_UP from the output terminal of inverter I4.

Inverter I5 is configured to generate the pre-charge signal PCHB_UP in response to the pre-charge signal PCH_UP. An input terminal of inverter I5 is configured to receive the pre-charge signal PCH_UP. The input terminal of inverter I5 is coupled to at least the output terminal of inverter I4 or node Nd8.

An output terminal of inverter I5 is configured to output the pre-charge signal PCHB_UP to at least node Nd9. In some embodiments, pre-charge signal PCHB_UP is inverted from pre-charge signal PCH_UP and vice versa. The output terminal of inverter I5 is coupled to at least node Nd9.

In some embodiments, each of the output terminal of inverter I5, node Nd9 and the gate of PMOS transistor P3 are coupled together. In some embodiments, the gate of PMOS transistor P3 is configured to receive pre-charge signal PCHB_UP from the output terminal of inverter I5.

In some embodiments, each of the output terminal of inverter I5, node Nd9 and the gate of NMOS transistor N2 are coupled together. In some embodiments, the gate of NMOS transistor N2 is configured to receive pre-charge signal PCHB_UP from the output terminal of inverter I5.

In some embodiments, each of the output terminal of inverter I5, node Nd9 and the gate of PMOS transistor P10 are coupled together. In some embodiments, the gate of PMOS transistor P10 is configured to receive pre-charge signal PCHB_UP from the output terminal of inverter I5.

In some embodiments, each of the output terminal of inverter I5, node Nd9, and at least the gate of NMOS transistor N2, the gate of PMOS transistor P3 or the gate of PMOS transistor P10 are coupled together.

Other configurations of circuit 400C are within the scope of the present disclosure. Other configurations of inverters, number of inverters or inverters type for at least inverter I4 or I5 are within the scope of the present disclosure.

FIG. 4D is a circuit diagram of a circuit 400D, in accordance with some embodiments.

Circuit 400D is configured to generate the pre-charge signal PCH_DN and the pre-charge signal PCHB_DN.

Circuit 400D is usable with integrated circuit 200 of FIG. 2 or pull-up circuit 400B of FIG. 4B, and similar detailed description is therefore omitted.

For example, in some embodiments, circuit 400D is usable with circuit 200 of FIG. 2 or circuit 600-1000 of corresponding FIGS. 6-10, and is coupled to at least the gate of NMOS transistor N3, the gate of PMOS transistor P4 or the gate of NMOS transistor N7.

For example, in some embodiments, circuit 400D is usable with pull-up circuit 400B of FIG. 4B, and is coupled to the gate terminal of PMOS transistor P11.

Circuit 400D includes an inverter I6 and an inverter I7. In some embodiments, circuit 400D is configured to generate the pre-charge signal PCH_DN and the pre-charge signal PCHB_DN.

Inverter I6 is configured to generate the pre-charge signal PCH_DN in response to a pre-charge signal RPCHB_DN. An input terminal of inverter I6 is configured to receive the pre-charge signal RPCHB_DN. In some embodiments, pre-charge signal RPCHB_DN is received from an external circuit (not shown). In some embodiments, the input terminal of inverter I6 is coupled to the external circuit (not shown). An output terminal of inverter I6 is configured to output the pre-charge signal PCH_DN to at least an input terminal of inverter I7 or node Nd10. In some embodiments, pre-charge signal PCH_DN is inverted from pre-charge signal RPCHB_DN and vice versa. The output terminal of inverter I6 is coupled to at least an input terminal of inverter I7 or node Nd10.

In some embodiments, each of the output terminal of inverter I6, node Nd10 and the gate of NMOS transistor N7 are coupled together. In some embodiments, the gate of NMOS transistor N7 is configured to receive pre-charge signal PCH_DN from the output terminal of inverter I6.

Inverter I7 is configured to generate the pre-charge signal PCHB_DN in response to the pre-charge signal PCH_DN. An input terminal of inverter I7 is configured to receive the pre-charge signal PCH_DN. The input terminal of inverter I7 is coupled to at least the output terminal of inverter I6 or node Nd10.

An output terminal of inverter I7 is configured to output the pre-charge signal PCHB_DN to at least node Nd11. In some embodiments, pre-charge signal PCHB_DN is inverted from pre-charge signal PCH_DN and vice versa. The output terminal of inverter I7 is coupled to at least node Nd11.

In some embodiments, each of the output terminal of inverter I7, node Nd11 and the gate of PMOS transistor P4 are coupled together. In some embodiments, the gate of PMOS transistor P4 is configured to receive pre-charge signal PCHB_DN from the output terminal of inverter I7.

In some embodiments, each of the output terminal of inverter I7, node Nd11 and the gate of NMOS transistor N3 are coupled together. In some embodiments, the gate of NMOS transistor N3 is configured to receive pre-charge signal PCHB_DN from the output terminal of inverter I7.

In some embodiments, each of the output terminal of inverter I7, node Nd11 and the gate of PMOS transistor P11 are coupled together. In some embodiments, the gate of PMOS transistor P11 is configured to receive pre-charge signal PCHB_DN from the output terminal of inverter I7.

In some embodiments, each of the output terminal of inverter I7, node Nd11, and at least the gate of NMOS transistor N3, the gate of PMOS transistor P4 or the gate of PMOS transistor P11 are coupled together.

Other configurations of circuit 400D are within the scope of the present disclosure. Other configurations of inverters, number of inverters or inverters type for at least inverter I6 or I7 are within the scope of the present disclosure.

Figure 4E:
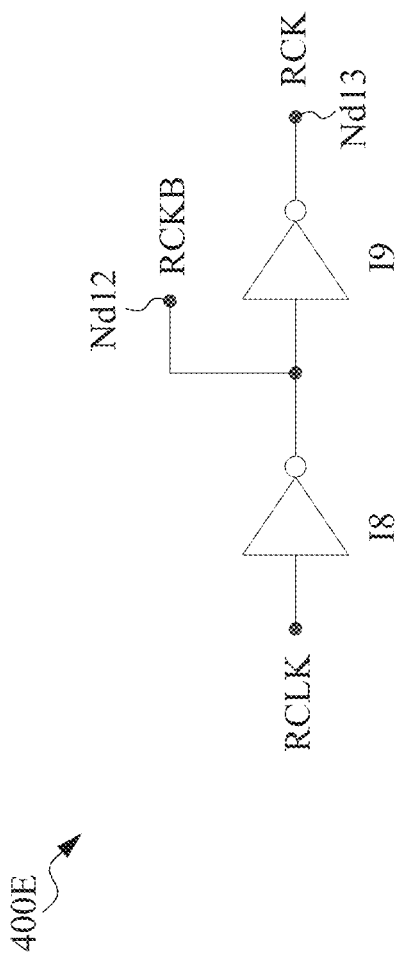
FIG. 4E is a circuit diagram of a circuit, in accordance with some embodiments.

FIG. 4E is a circuit diagram of a circuit 400E, in accordance with some embodiments.

Circuit 400E is configured to generate the clock signal RCKB and the clock signal RCK.

Circuit 400E is usable with integrated circuit 200 of FIG. 2, and similar detailed description is therefore omitted.

For example, in some embodiments, circuit 400E is usable with circuit 200 of FIG. 2 or circuit 600-1000 of corresponding FIGS. 6-10, and is coupled to at least the gate of NMOS transistor N1, the gate of PMOS transistor P2 or the gate of NMOS transistor N4.

Circuit 400E includes an inverter I8 and an inverter I9. In some embodiments, circuit 400E is configured to generate the clock signal RCKB and the clock signal RCK.

Inverter I8 is configured to generate the clock signal RCKB in response to a clock signal RCLK. An input terminal of inverter I8 is configured to receive the clock signal RCLK. In some embodiments, clock signal RCLK is received from an external circuit (not shown). In some embodiments, at least clock signal RCLK, RCKB or RCK is a read clock signal configured to cause circuit 200 to read data stored in memory cell array 102. In some embodiments, the input terminal of inverter I8 is coupled to the external circuit (not shown). An output terminal of inverter I8 is configured to output the clock signal RCKB to at least an input terminal of inverter I9 or node Nd12. In some embodiments, clock signal RCKB is inverted from clock signal RCLK and vice versa. The output terminal of inverter I8 is coupled to at least an input terminal of inverter I9 or node Nd12.

In some embodiments, each of the output terminal of inverter I8, node Nd12 and the gate of NMOS transistor N4 are coupled together. In some embodiments, the gate of NMOS transistor N4 is configured to receive clock signal RCKB from the output terminal of inverter I8.

In some embodiments, each of the output terminal of inverter I8, node Nd12 and the gate of PMOS transistor P1 are coupled together. In some embodiments, the gate of PMOS transistor P1 is configured to receive clock signal RCKB from the output terminal of inverter I8.

In some embodiments, at least the output terminal of inverter I8, node Nd12, the gate of NMOS transistor N4 or the gate of PMOS transistor P1 are coupled together.

Inverter I9 is configured to generate the clock signal RCK in response to the clock signal RCKB. An input terminal of inverter I9 is configured to receive the clock signal RCKB. The input terminal of inverter I9 is coupled to at least the output terminal of inverter I8 or node Nd12.

An output terminal of inverter I9 is configured to output the clock signal RCK to at least node Nd13. In some embodiments, clock signal RCK is inverted from clock signal RCKB and vice versa. The output terminal of inverter I9 is coupled to at least node Nd13.

In some embodiments, each of the output terminal of inverter I9, node Nd13 and the gate of PMOS transistor P2 are coupled together. In some embodiments, the gate of PMOS transistor P2 is configured to receive clock signal RCK from the output terminal of inverter I9.

In some embodiments, each of the output terminal of inverter I9, node Nd13 and the gate of NMOS transistor N1 are coupled together. In some embodiments, the gate of NMOS transistor N1 is configured to receive clock signal RCK from the output terminal of inverter I9.

In some embodiments, at least the output terminal of inverter I9, node Nd13, the gate of NMOS transistor N1 or the gate of PMOS transistor P2 are coupled together.

Other configurations of circuit 400E are within the scope of the present disclosure. Other configurations of inverters, number of inverters or inverters type for at least inverter I8 or I9 are within the scope of the present disclosure.

Waveforms

Figure 5:
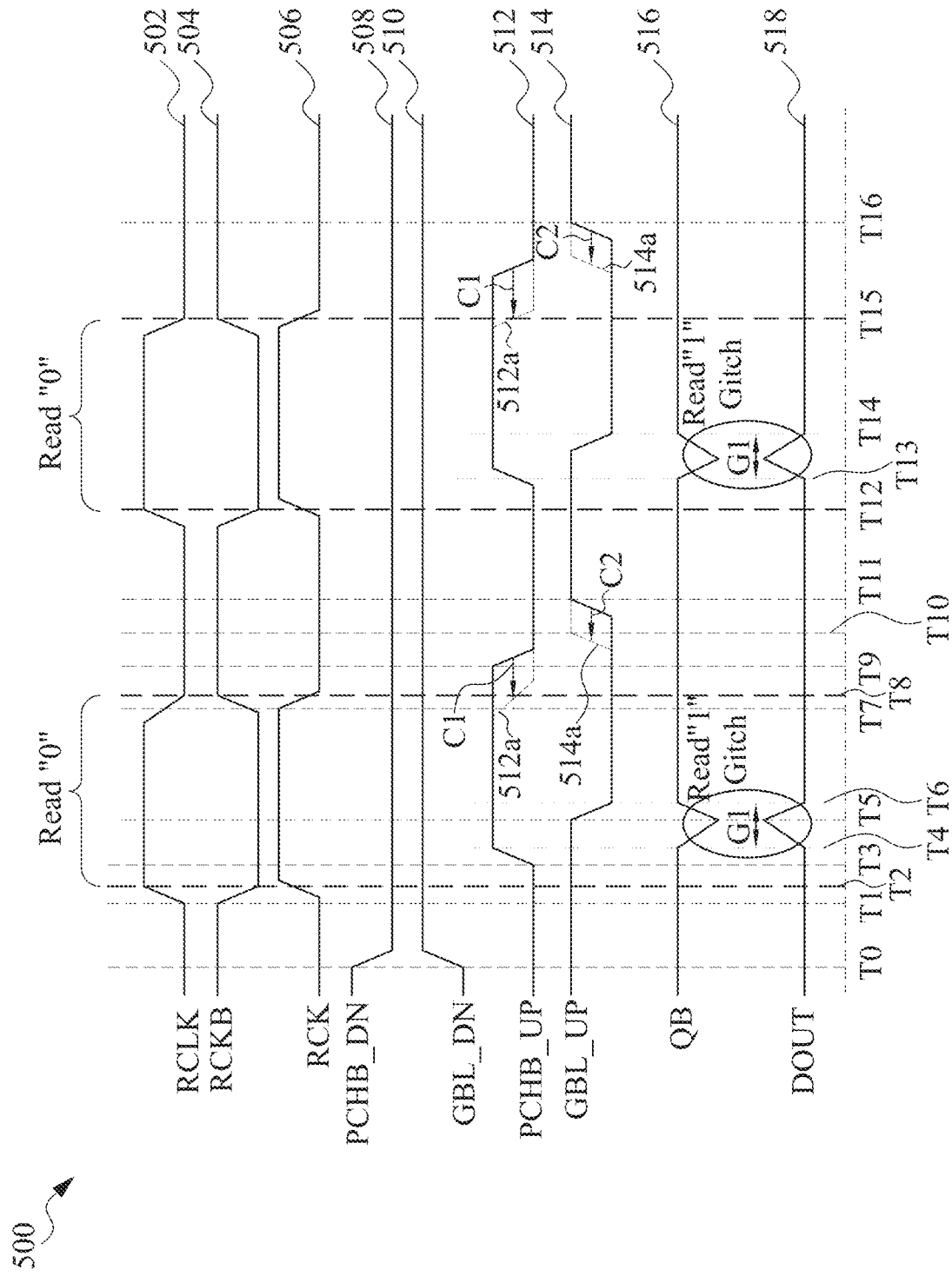
FIG. 5 is a timing diagram of waveforms of a memory circuit, in accordance with some embodiments.

FIG. 5 is a timing diagram 500 of waveforms of a memory circuit, such as circuit 200 in FIG. 2, in accordance with some embodiments.

In some embodiments, FIG. 5 is a timing diagram 500 of waveforms of at least circuit 300-400E of FIGS. 3-4E or circuit 600-1000 in FIGS. 6-10, in accordance with some embodiments.

At time T0, pre-charge signal PCHB_DN (e.g., waveform 508) transitions from logically high to logically low, thereby causing PMOS transistor P11 of pre-charge circuit 400B to turn on. In response to PMOS transistor P11 of pre-charge circuit 400B turning on, node Nd2 is pulled towards voltage supply VDD and thereby causes global bit line signal GBL_DN (e.g., waveform 510) to transition from logically low to logically high. At time T0, since clock signal RCK (e.g., waveform 506) is logically low, NMOS transistor N1 is turned off, and since clock signal RCKB (e.g., waveform 504) is logically high, PMOS transistor P1 is turned off, and thus NAND gate 220 is electrically floating.

At time T1, pre-charge signal PCHB_DN is logically low, and global bit line signal GBL_DN is logically high. At time T1, clock signal RCLK (e.g., waveform 502) transitions from logically low to logically high, thereby causing clock signal RCKB to transition from logically high to logically low, and clock signal RCK to transition from logically low to logically high.

In response to the transition of clock signal RCKB from logically high to logically low, PMOS transistor P1 turns on, and thereby couples the first voltage supply node Nd3 of NAND logic gate 220 to supply voltage node VDDN. In response to the transition of clock signal RCK from logically low to logically high, NMOS transistor N1 turns on. However, since pre-charge signals PCHB_DN and PCHB_UP (e.g., waveform 512) are both logically low, corresponding NMOS transistors N3 and N2 are turned off, and the second voltage supply node Nd4 of NAND logic gate 220 is not coupled to reference supply voltage node VSSN. Thus, the second voltage supply node Nd4 of NAND logic gate 220 is electrically floating.

At time T2, clock signal RCLK is logically high, clock signal RCKB is logically low, signal QB is logically high, and data signal DOUT is logically low. In some embodiments, the time T2-T8 is referred to as a read "0" since the data stored in memory cell 102a is a logical low or "0".

At time T3, pre-charge signal PCHB_UP transitions from logically low to logically high, thereby causing PMOS transistor P10 of pre-charge circuit 400A to begin to turn off. In response to PMOS transistor P10 of pre-charge circuit 400A turning off node Nd1 is decoupled from the voltage supply node VDDN, and the global bit line signal GBL_UP (e.g., waveform 514) is no longer pre-charged logically high by PMOS transistor P10. In some embodiments, since global bit line signal GBL_UP is no longer pre-charged logically high by PMOS transistor P10, data stored in memory cell 102a are reflected on the global bit line signal GBL_UP.

At time T4, pre-charge signal PCHB_UP is still transitioning from logically low to logically high, however, pre-charge signal PCHB_UP is almost logically high thereby causing NMOS transistor N2 to turn on. In response to NMOS transistor N2 turning on, the second voltage supply node Nd4 of NAND logic gate 220 is coupled to reference supply voltage node VSSN. Thus, NAND logic gate 220 is not electrically floating. Since global bit line signal GBL_UP and GBL_DN are both logically high and NAND logic gate 220 is not electrically floating, the output of NAND logic gate 220 is logically low, thereby causing signal QB (e.g., waveform 516) to transition from logically high to logically low at time T4. In response to signal QB transitioning from logically high to logically low, data signal DOUT (e.g., waveform 518) transitions from logically low to logically high at time T4.

At time T5, signal QB is logically low, and data signal DOUT is logically high. When data signal DOUT is logically high, circuit 200 reads the data stored in memory cell 102a as a "1" even though the data stored in memory cell 102a is a "0", and is referred to as a read "1" glitch. In some embodiments, a glitch is an unnecessary or undesirable signal transition.

At time T5, global bit line signal GBL_UP transitions from logically high to logically low, thereby causing the output of NAND logic gate 220 to begin to transition from logically low to logically high, thereby causing signal QB to transition from logically low to logically high. In response to signal QB transitioning from logically low to logically high, data signal DOUT transitions from logically high to logically low at time T5.

At time T6, global bit line signal GBL_UP is logically low, thereby causing the output of NAND logic gate 220 to be logically high, thereby causing signal QB to be logically high. In response to signal QB being logically high, data signal DOUT is logically low at time T6. When data signal DOUT is logically low, circuit 200 correctly reads the data stored in memory cell 102a as a "0", and circuit 200 resolves the read "1" glitch.

Time T4-T6 is referred to as a read "1" glitch, and the read "1" glitch between time T2-T4 has a duration G1. In some embodiments, by including NMOS transistor N2 in circuit 200, and delaying the transition of pre-charge signal PCHB_UP from logically low to logically high (e.g., time T3), the duration G1 of the read "1" glitch is reduced compared to other approaches.

At time T7, clock signal RCLK is transitioning from logically high to logically low, thereby causing clock signal RCKB to transition from logically low to logically high, and clock signal RCK to transition from logically high to logically low.

At time T8, clock signal RCLK is logically low, thereby causing clock signal RCKB to be logically high, and clock signal RCK is still transitioning from logically high to logically low.

In response to clock signal RCKB being logically high, PMOS transistor P1 is turned off, thereby disconnecting the first voltage supply node Nd3 of NAND logic gate 220 to supply voltage node VDDN.

In response to clock signal RCK transitioning from logically high to logically low, NMOS transistor N1 is turned off, thereby causing the second voltage supply node Nd4 of NAND logic gate 220 to be decoupled from the reference supply voltage node VSSN. Thus, the second voltage supply node Nd4 of NAND logic gate 220 is electrically floating. In some embodiments, changes on the inputs of NAND logic gate 220 are not reflected on the output since the NAND logic gate 220 is electrically floating. In some embodiments, during this time, latch 230 is configured to maintain the state of node Nd5 and signal QB and data signal DOUT.

At time T9, pre-charge signal PCHB_UP transitions from logically high to logically low, thereby causing PMOS transistor P10 of pre-charge circuit 400A to begin to turn on. In response to PMOS transistor P10 of pre-charge circuit 400A turning on, node Nd1 is coupled to the voltage supply node VDDN, and the global bit line signal GBL_UP becomes pre-charged logically high by PMOS transistor P10 between time T10-T11.

Between time T9-T10, pre-charge signal PCHB_UP finishes transitioning to logically high.

Between time T10-T11, global bit line signal GBL_UP transitions from logically low to logically high.

At time T11, global bit line signal GBL_UP is logically high.

As shown in FIG. 5, a falling edge 512a of pre-charge signal PCHB_UP can be advanced in time by a duration C1. Similarly, a rising edge 514a of global bit line signal GBL_UP can be advanced in time by a duration C2. In some embodiments, the duration C2 is equal to the duration C1. In some embodiments, the duration C2 is different from the duration C1.

Thus, as the falling edge of the pre-charge signal PCHB_UP is advanced in time, thereby causes the rising edge of the global bit signal GBL_UP to also be advanced in time and vice versa.

In some embodiments, the falling edge of the pre-charge signal PCHB_UP is delayed from the falling edge of the clock signal RCK, but the delay between the falling edge of the pre-charge signal PCHB_UP and the falling edge of the clock signal RCK is less than the delay of other approaches. In some embodiments, the falling edge of the pre-charge signal PCHB_UP occurs at a same time as the falling edge of the clock signal RCK. In some embodiments, by advancing the falling edge of the pre-charge signal PCHB_UP, and reducing the delay between the falling edge of the pre-charge signal PCHB_UP and the falling edge of the clock signal RCK, circuit 200 can be pre-charged quicker than other approaches resulting in read cycle improvement.

From T12-T16, circuit 200 is arranged to have a similar configuration as circuit 200 from time T0-T11. Therefore, detailed description with respect to circuit 200 from time T12-T16 are omitted for brevity.

In some embodiments, latch 230 is configured to maintain the state of node Nd5 and signal QB and data signal DOUT when NAND gate 220 is electrically floating.

For example, when clock signal RCK is logically low, PMOS transistor P2 is turned on, and when clock signal RCKB is logically high, NMOS transistor N4 is turned on, thereby enabling inverter I3. In some embodiments, inverter I3 is enabled when inverter I3 is coupled to voltage supply node VDDN and reference supply node VSSN. Thus, in some embodiments, between at least time T0-T1, T8-T12 and T15-T16, inverter I3 is enabled by PMOS transistor P2 and NMOS transistor N4, and latch 230 maintains the state of node Nd5 and signal QB and data signal DOUT.

For example, when pre-charge signal PCHB_UP is logically low, PMOS transistor P3 is turned on, and when pre-charge signal PCH_UP is logically high, NMOS transistor N6 is turned on, and when pre-charge signal PCHB_DN is logically low, PMOS transistor P4 is turned on, and when pre-charge signal PCH_DN is logically high, NMOS transistor N7 is turned on, thereby enabling inverter I3.

Thus, in some embodiments, between at least time T9-T13 or T8-T12 (e.g., for curve 512a where pre-charge signal PCHB_UP is advanced by duration C1), inverter I3 is enabled by PMOS transistors P3 and P4 and NMOS transistors N6 and N7, and latch 230 maintains the state of node Nd5 and signal QB and data signal DOUT. In some embodiments, the waveform of pre-charge signal PCHB_UP and the waveform of pre-charge signal PCHB_DN are substituted with each other. In some embodiments, the waveform of global bit line signal GBL_UP and the waveform of global bit line signal GBL_DN are substituted with each other. Other timing diagrams of waveforms of circuit 200, 400A-400E, 600-900A and 1000 are within the scope of the present disclosure.

Figure 6:
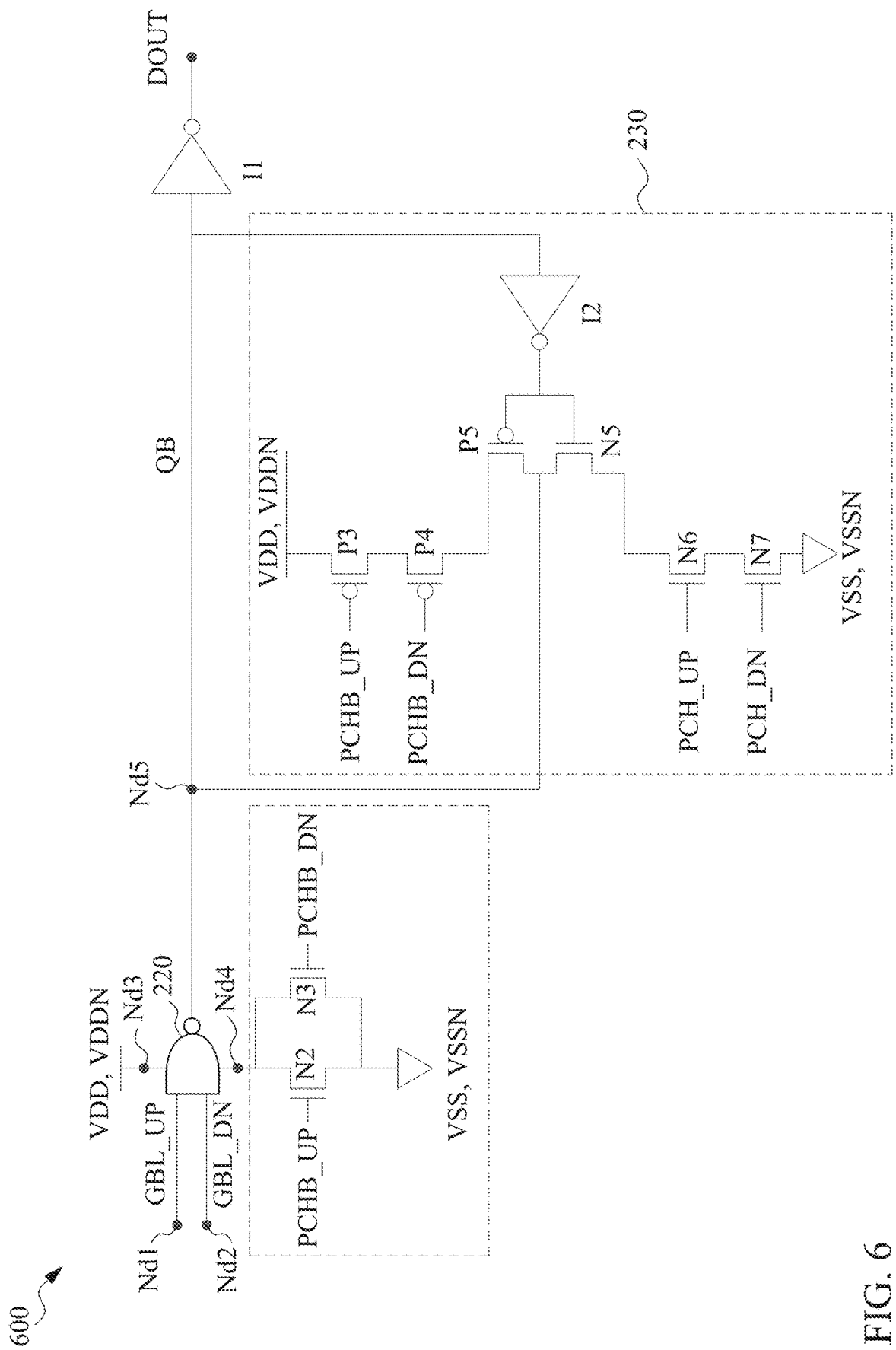
FIG. 6 is a circuit diagram of a circuit, in accordance with some embodiments.

FIG. 6 is a circuit diagram of a circuit 600, in accordance with some embodiments.

Circuit 600 is a variation of circuit 200 of FIG. 2, and similar detailed description is therefore omitted. In comparison with circuit 200 of FIG. 2, circuit 600 does not include NMOS transistors N1 and N4, and PMOS transistors P1 and P2. By not including NMOS transistors N1 and N4, and PMOS transistors P1 and P2, circuit 600 includes less toggling transistors than other approaches thereby reducing power consumption.

In some embodiments, by not including NMOS transistors N1 and N4, and PMOS transistors P1 and P2, circuit 600 does not toggle responsive to clock signals RCK and RCKB.

Circuit 600 is an embodiment of GIO circuit 106 of FIG. 1, and similar detailed description is therefore omitted.

Circuit 600 includes NAND logic gate 220, NMOS transistors N2, N3, N5, N6 and N7, PMOS transistors P3, P4 and P5, and inverters I1 and I2.

In comparison with circuit 200 of FIG. 2, circuit 600 does not include NMOS transistors N1 and N4, and PMOS transistors P1 and P2.

By not including PMOS transistor P1, the first voltage supply node Nd3 of NAND logic gate 220 of circuit 600 is directly coupled to supply voltage node VDDN, and receives supply voltage VDD. Similarly, the source terminals of PMOS transistors P8 and P9 of NAND logic gate circuit 300 FIG. 3 are directly coupled to supply voltage node VDDN, and receives supply voltage VDD.

By not including NMOS transistor N1, the source terminals of NMOS transistors N2 and N3 are directly coupled to reference supply voltage node VSSN, and receives reference supply voltage VSS.

In some embodiments, by not including NMOS transistor N1 and PMOS transistor P1, circuit 600 does not include stacked PMOS transistors thereby causing the speed of NAND logic gate 220 to increase compared with other approaches.

In some embodiments, by not including PMOS transistor P2 and NMOS transistor N4, PMOS transistor P5 is coupled to the supply voltage node VDDN by a single path (e.g., by PMOS transistors P3 and P4), and NMOS transistor N5 is coupled to the reference supply voltage node VSSN by a single path (e.g., by NMOS transistors N6 and N7). In other words, PMOS transistor P5 is not coupled to the supply voltage node VDDN by PMOS transistor P2, and NMOS transistor N5 is not coupled to the reference supply voltage node VSSN by NMOS transistor N4.

In some embodiments, by not including NMOS transistors N1 and N4, and PMOS transistors P1 and P2, circuit 600 does not toggle or change states in response to clock signals RCK and RCKB, thereby reducing power consumption compared with other approaches.

In some embodiments, a timing diagram of the operation of circuit 600 is similar to the timing diagram 500 of FIG. 5, but the timing diagram of the operation of circuit 600 does not include clock signals RCLK, RCK and RCKB, and similar detailed description is omitted.

Other configurations of transistors, number of transistors or transistor types of circuit 600 are within the scope of the present disclosure.

Figure 7:
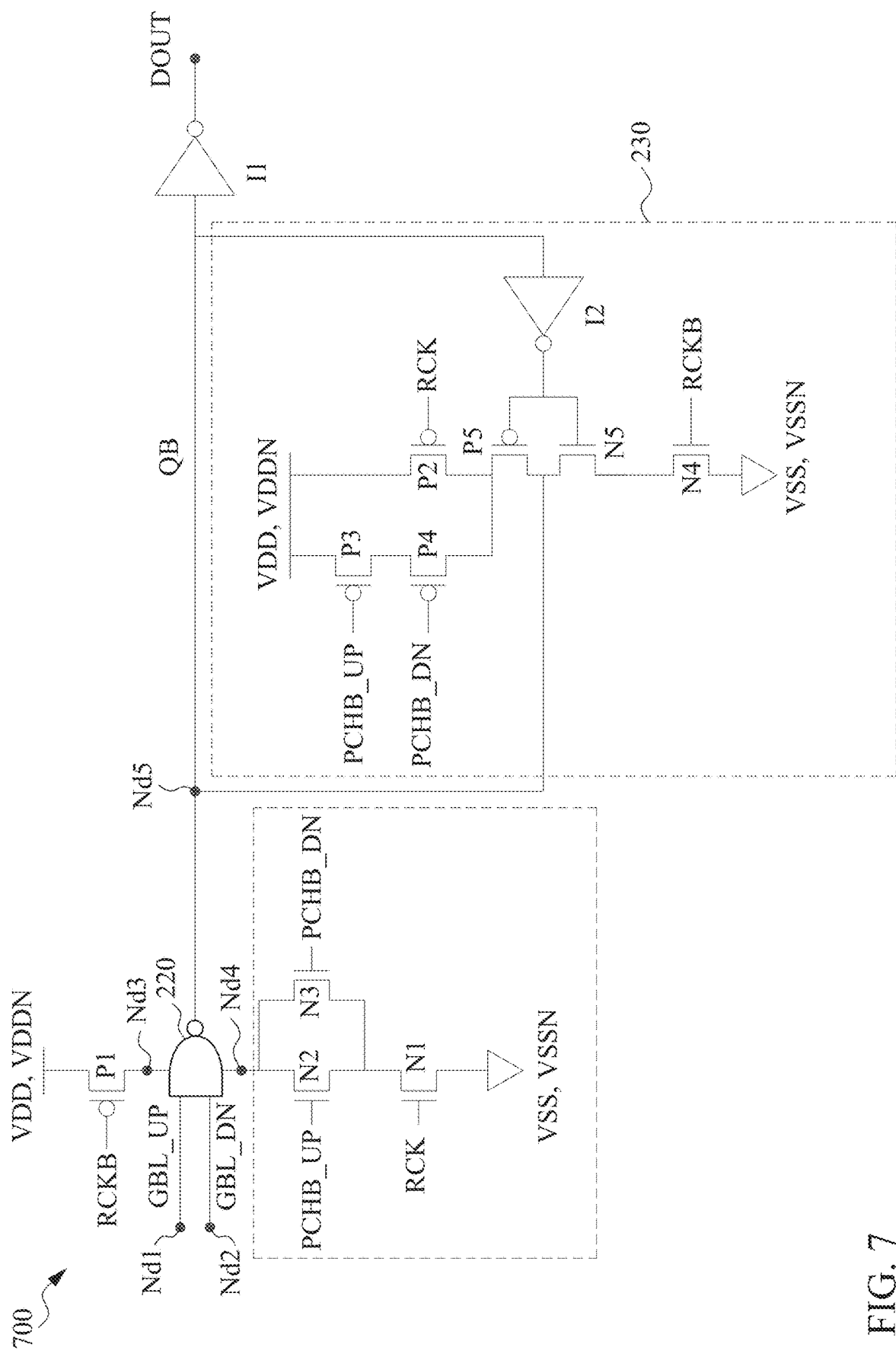
FIG. 7 is a circuit diagram of a circuit, in accordance with some embodiments.

FIG. 7 is a circuit diagram of a circuit 700, in accordance with some embodiments.

Circuit 700 is a variation of circuit 200 of FIG. 2, and similar detailed description is therefore omitted. In comparison with circuit 200 of FIG. 2, circuit 700 does not include NMOS transistors N6 and N7. By not including NMOS transistors N6 and N7, circuit 700 includes less toggling transistors than other approaches thereby reducing power consumption.

In some embodiments, by not including NMOS transistors N6 and N7, circuit 700 does not include transistors toggling responsive to pre-charge signals PCH_UP and PCH_DN.

Circuit 700 is an embodiment of GIO circuit 106 of FIG. 1, and similar detailed description is therefore omitted.

Circuit 700 includes NAND logic gate 220, NMOS transistors N1, N2, N3, N4 and N5, PMOS transistors P1, P2, P3, P4 and P5, and inverters I1 and I2.

In comparison with circuit 200 of FIG. 2, circuit 700 does not include NMOS transistors N6 and N7.

In some embodiments, by not including NMOS transistors N6 and N7, NMOS transistor N5 is coupled to the reference supply voltage node VSSN by a single path (e.g., by NMOS transistor N4). In other words, NMOS transistor N5 is not coupled to the reference supply voltage node VSSN by NMOS transistors N6 and N7. In some embodiments, by not including NMOS transistors N6 and N7, circuit 700 includes less transistors thereby reducing power consumption compared with other approaches.

In some embodiments, a timing diagram of the operation of circuit 700 is similar to the timing diagram 500 of FIG. 5, and similar detailed description is omitted.

Other configurations of transistors, number of transistors or transistor types of circuit 700 are within the scope of the present disclosure.

Figure 8:
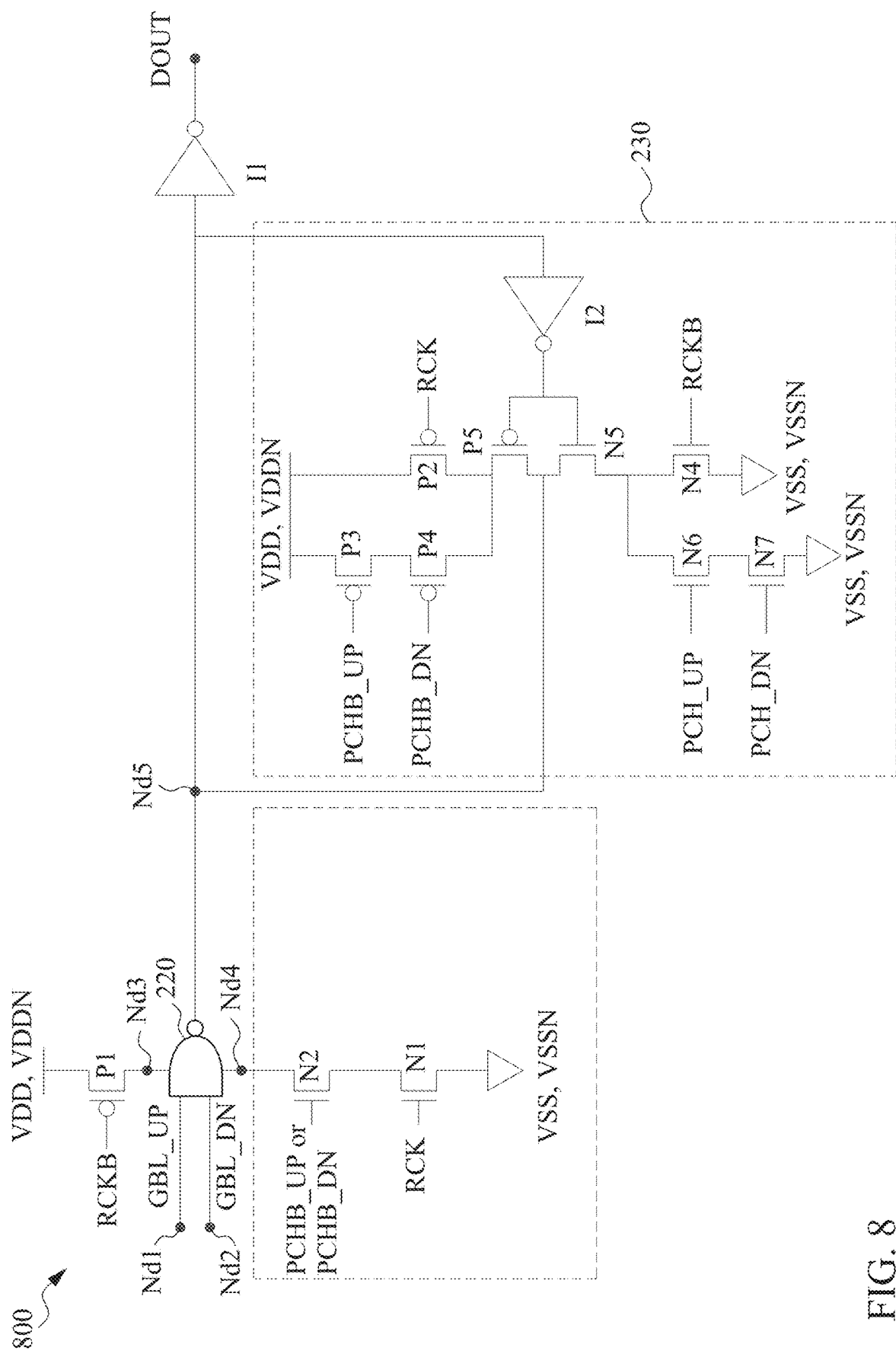
FIG. 8 is a circuit diagram of a circuit, in accordance with some embodiments.

FIG. 8 is a circuit diagram of a circuit 800, in accordance with some embodiments.

Circuit 800 is a variation of circuit 200 of FIG. 2, and similar detailed description is therefore omitted. In comparison with circuit 200 of FIG. 2, circuit 800 does not include NMOS transistor N3, and NMOS transistor N2 is controlled by either pre-charge signal PCHB_UP or PCHB_DN. By not including NMOS transistor N3, circuit 800 includes less toggling transistors than other approaches thereby reducing power consumption.

Circuit 800 is an embodiment of GIO circuit 106 of FIG. 1, and similar detailed description is therefore omitted.

Circuit 800 includes NAND logic gate 220, NMOS transistors N1, N2, N4, N5, N6 and N7, PMOS transistors P1, P2, P3, P4 and P5, and inverters I1 and I2.

In comparison with circuit 200 of FIG. 2, circuit 800 does not include NMOS transistor N3. In some embodiments, NMOS transistor N2 is controlled by either pre-charge signal PCHB_UP or PCHB_DN. In some embodiments, by not including NMOS transistor N3, the second voltage supply node ND4 of NAND logic gate 220 is coupled to the reference supply voltage node VSSN by a single path (e.g., by NMOS transistors N1 and N2). In other words, the second voltage supply node ND4 of NAND logic gate 220 is not coupled to the reference supply voltage node VSSN by NMOS transistor N3.

In some embodiments, by not including NMOS transistor N3, circuit 800 includes less transistors thereby reducing power consumption compared with other approaches.

In some embodiments, a timing diagram of the operation of circuit 800 is similar to the timing diagram 500 of FIG. 5, and similar detailed description is omitted.

Other configurations of transistors, number of transistors or transistor types of circuit 800 are within the scope of the present disclosure.

Figure 9A:
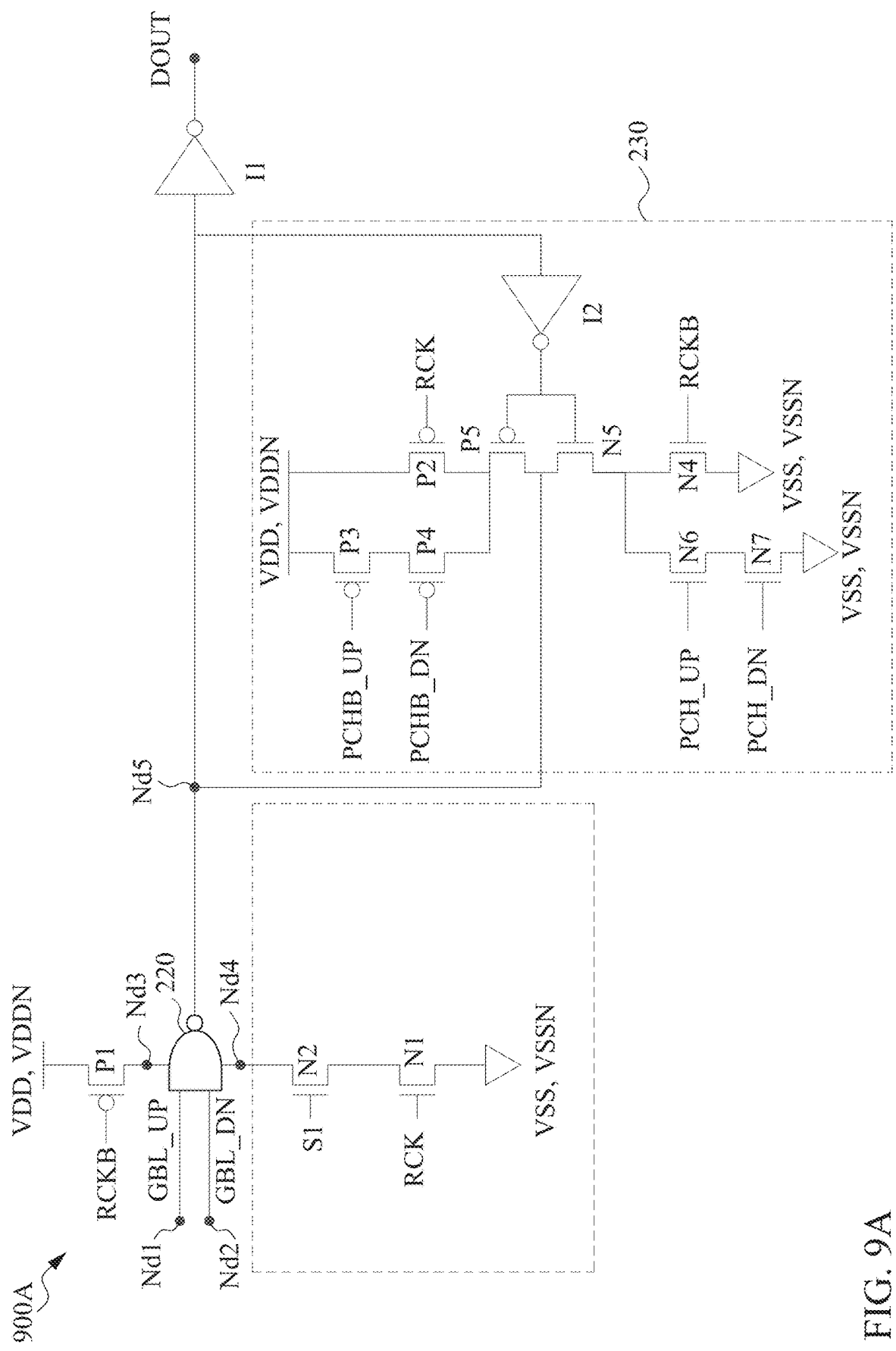
FIG. 9A is a circuit diagram of a circuit, in accordance with some embodiments.

FIG. 9A is a circuit diagram of a circuit 900A, in accordance with some embodiments.

Circuit 900A is a variation of circuit 800 of FIG. 8, and similar detailed description is therefore omitted. In comparison with circuit 800 of FIG. 8, NMOS transistor N2 is controlled by control signal S1 (e.g., shown as waveform 914 in FIG. 9B). In some embodiments, control signal S1 has a same logical level and same timing characteristics as at least pre-charge signal PCHB_UP or PCHB_DN, and similar detailed description is therefore omitted. In some embodiments, signal S1 is an inverted version of at least global bit line signal GBL_UP or GBL_DN.

Figure 9B:
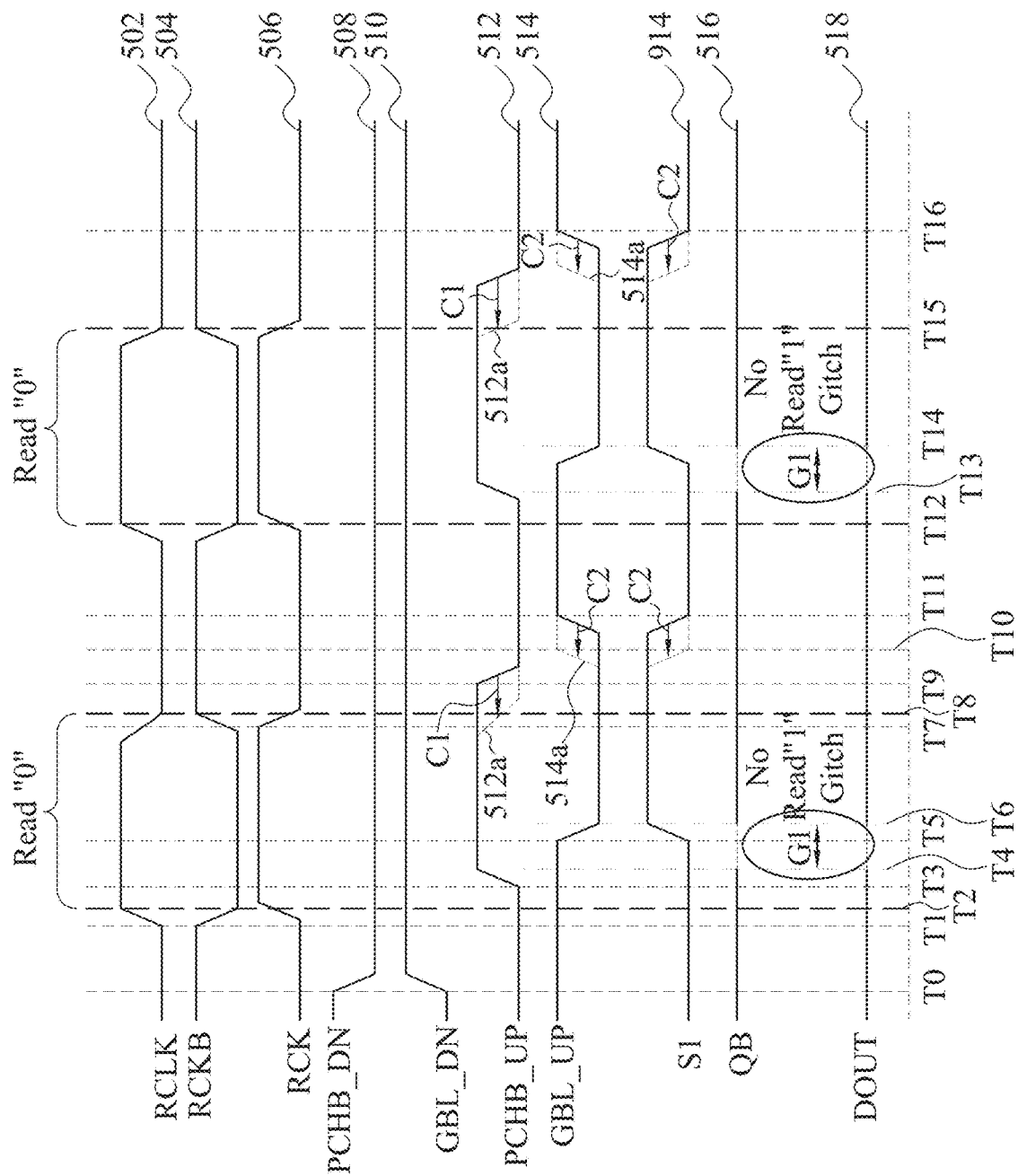
FIG. 9B is a timing diagram of waveforms of a memory circuit, in accordance with some embodiments.

In some embodiments, control signal S1 is received from an external circuit (not shown). In some embodiments, the gate terminal of NMOS transistor N2 is coupled to the external circuit (not shown), and is configured to receive control signal S1. In some embodiments, by being generated by an external circuit (not shown), control signal S1 does not have the same waveform profile as pre-charge signal PCHB_UP or PCHB_DN, and can have other waveform profiles as shown in FIG. 9B.

In comparison with circuit 800 of FIG. 8, NMOS transistor N2 of circuit 900A is not controlled by either pre-charge signal PCHB_UP or PCHB_DN. In some embodiments, by controlling NMOS transistor N2 of circuit 900A by signal S1, and not pre-charge signal PCHB_UP or PCHB_DN, signal S1 can track the behavior or be the same as pre-charge signal PCHB_UP or PCHB_DN thus preventing the read "1" glitch (described below in FIG. 9B.)

Circuit 900A is an embodiment of GIO circuit 106 of FIG. 1, and similar detailed description is therefore omitted.

Circuit 900A includes NAND logic gate 220, NMOS transistors N1, N2, N4, N5, N6 and N7, PMOS transistors P1, P2, P3, P4 and P5, and inverters I1 and I2.

In some embodiments, by not including NMOS transistor N3, circuit 900A includes less toggling transistors thereby reducing power consumption compared with other approaches.

Other configurations of transistors, number of transistors or transistor types of circuit 900A are within the scope of the present disclosure.

FIG. 9B is a timing diagram 900B of waveforms of a memory circuit, such as circuit 900A in FIG. 9A, in accordance with some embodiments. In some embodiments, FIG. 9B is a timing diagram 900B of waveforms of at least circuit 900A or 1000 in FIGS. 9A and 10, in accordance with some embodiments.

In some embodiments, timing diagram 900B is timing diagram 500 of FIG. 5, but further includes signal S1, and similar detailed description is therefore omitted.

In FIG. 9B, signal S1 is described in timing diagram 900B, but timing diagram 900B further includes the similar features of waveform 500 of FIG. 5, and similar detailed is therefore omitted. In some embodiments, signal S1 is an inverted version of global bit line signal GBL_UP, thus causing the read '1" glitch to be completely removed from signal QB and data signal DOUT as shown in FIG. 9B. In some embodiments, signal S1 is an inverted version of global bit line signal GBL_DN.

Waveform 900B is described from time T3-T6, and other details of signal S1 transitioning in FIG. 9B and the effect on memory circuit 900A are not described for brevity, but are similar to the timing of global bit line signal GBL_UP described in FIG. 5 and the voltage levels of pre-charge signal PCHB_UP described in FIG. 5, and similar detailed description is therefore omitted.

From time T3-T4, pre-charge signal PCHB_UP transitions from logically low to logically high, however, in FIG. 9A NMOS transistor N2 does not turn on since NMOS transistor N2 is controlled by signal S1. Since NMOS transistor N2 does not turn on in response to the transition of pre-charge signal PCHB_UP, signal QB does not transition from logically high to logically low at time T4 in FIG. 9B as is done in FIG. 5, and data signal DOUT does not transition from logically low to logically high at time T4 in FIG. 9B.

At time T5 in FIG. 9B, global bit line signal GBL_UP transitions from logically high to logically low, and signal S1 transitions from logically low to logically high. However, since the transition of global bit line signal GBL_UP from logically high to logically low, is at the same time as the transition of signal S1 from logically low to logically high, the read "1" glitch is effectively removed from signal QB and data signal DOUT. For example, in response to the transition of signal S1 from logically low to logically high, NMOS transistor N2 is turned on thereby causing the second voltage supply node Nd4 of NAND logic gate 220 to be coupled to reference supply voltage node VSSN. Therefore, NAND logic gate 220 is not electrically floating. Furthermore, in response to the transition of global bit line signal GBL_UP from logically high to logically low and NAND logic gate 220 not being electrically floating, the output of NAND logic gate 220 remains logically high since at least one of global bit line signal GBL_UP or GBL_DN is logically low. Thus, the output of NAND logic gate 220 and signal QB is logically high, and data signal DOUT is logically low.

At time T6, global bit line signal GBL_UP is logically low, signal S1 is logically high, signal QB is logically high and data signal DOUT is logically low.

The details of the operation of circuit 900A from time T12-T15 of timing diagram 900B are the same as details of the operation of circuit 900A from time T3-T6, and same detailed description is therefore omitted.

Figure 10:
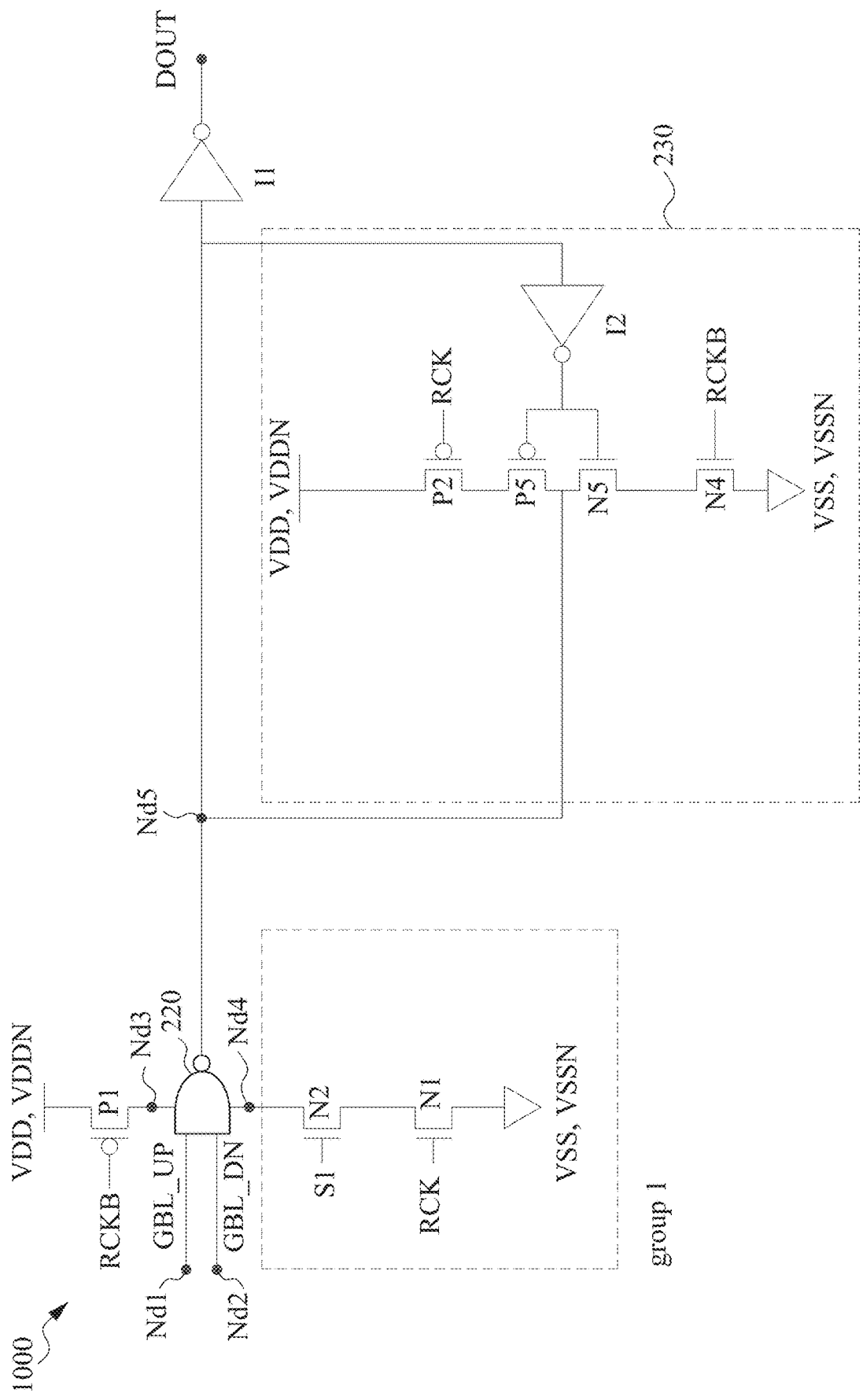
FIG. 10 is a circuit diagram of a circuit, in accordance with some embodiments.

FIG. 10 is a circuit diagram of a circuit 1000, in accordance with some embodiments.

Circuit 1000 is a variation of memory circuit 900A of FIG. 9A, and similar detailed description is therefore omitted. In comparison with memory circuit 900 of FIG. 9, circuit 1000 does not include NMOS transistors N6 and N7, and PMOS transistors P3 and P4. By not including NMOS transistors N6 and N7, and PMOS transistors P3 and P4, circuit 1000 includes less toggling transistors than other approaches thereby reducing power consumption.

In some embodiments, by not including NMOS transistors N6 and N7, and PMOS transistors P3 and P4, circuit 1000 does not toggle responsive to pre-charge signals PCHB_UP, PCHB_DN, PCH_UP and PCH_DN.

Circuit 1000 is an embodiment of GIO circuit 106 of FIG. 1, and similar detailed description is therefore omitted.

Circuit 1000 includes NAND logic gate 220, NMOS transistors N1, N2, N4 and N5, PMOS transistors P1, P2 and P5, and inverters I1 and I2.

In comparison with memory circuit 900A of FIG. 9A, circuit 1000 does not include NMOS transistors N6 and N7, and PMOS transistors P3 and P4.

In some embodiments, by not including PMOS transistors P3 and P4 and NMOS transistors N6 and N7, PMOS transistor P5 is coupled to the supply voltage node VDDN by a single path (e.g., by PMOS transistor P2), and NMOS transistor N5 is coupled to the reference supply voltage node VSSN by a single path (e.g., by NMOS transistor N4). In other words, PMOS transistor P5 is not coupled to the supply voltage node VDDN by PMOS transistors P3 and P4, and NMOS transistor N5 is not coupled to the reference supply voltage node VSSN by NMOS transistors N6 and N7.

In some embodiments, by not including NMOS transistors N6 and N7, and PMOS transistors P3 and P4, circuit 1000 does not toggle or change states in response to pre-charge signals PCHB_UP, PCHB_DN, PCH_UP and PCH_DN, thereby reducing power consumption compared with other approaches.

In some embodiments, by not including NMOS transistors N6 and N7, and PMOS transistors P3 and P4, circuit 1000 includes less toggling transistors thereby reducing power consumption compared with other approaches.

In some embodiments, a timing diagram of the operation of circuit 1000 is similar to the timing diagram 900B of FIG. 9B, and similar detailed description is omitted.

Other configurations of transistors, number of transistors or transistor types of circuit 1000 are within the scope of the present disclosure.

Method

Figure 11:
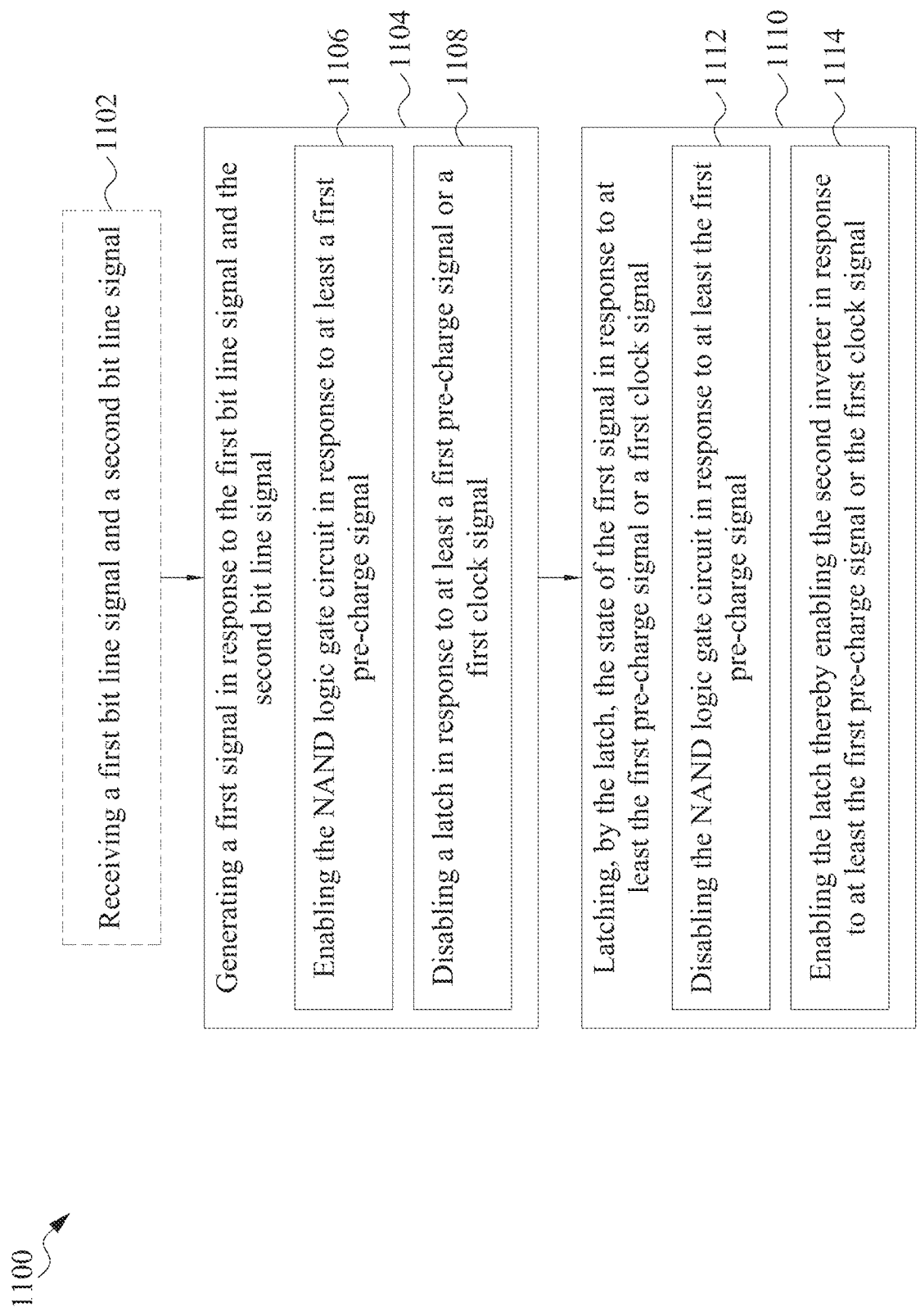
FIG. 11 is a flowchart of a method of operating a circuit, in accordance with some embodiments.

FIG. 11 is a flowchart of a method of operating a circuit, in accordance with some embodiments.

In some embodiments, FIG. 11 is a flowchart of a method of operating the memory circuit of FIG. 1 or the circuit of FIG. 2-3, 4A-4E, or 6-10. It is understood that additional operations may be performed before, during, and/or after the method 1100 depicted in FIG. 11, and that some other operations may only be briefly described herein. It is understood that method 1100 utilizes features of one or more of circuits 100, 200, 300, 400A-400E, 600, 700, 800, 900A or 1000, or waveform 500 of FIG. 5.

In operation 1102 of method 1100, a first bit line signal and a second bit line signal are received by a NAND logic gate circuit 220. In some embodiments, the first bit line signal of method 1100 includes global bit line signal GBL_UP. In some embodiments, the second bit line signal of method 1100 includes global bit line signal GBL_DN.

In operation 1104 of method 1100, a first signal is generated by the NAND logic gate circuit in response to the first bit line signal and the second bit line signal. In some embodiments, the first signal of method 1100 includes signal QB.

In some embodiments, operation 1104 includes at least operation 1106 or 1108.

In operation 1106 of method 1100, the NAND logic gate circuit is enabled in response to at least a first pre-charge signal. In some embodiments, the first pre-charge signal of method 1100 includes at least pre-charge signal PCHB_UP or PCHB_DN. In some embodiments, operation 1106 includes at least operation 1106a, 1106b or 1106c.

In some embodiments, operation 1106a includes turning on at least a first N-type transistor in response to the first pre-charge signal. In some embodiments, the first N-type transistor is coupled between the NAND logic gate and reference supply voltage node VSSN. In some embodiments, the first N-type transistor of method 1100 includes at least NMOS transistor N2 or N3. In some embodiments, operation 1106b includes turning off at least a first P-type transistor in response to the first pre-charge signal. In some embodiments, the first P-type transistor coupled to an input of the NAND logic gate. In some embodiments, the first P-type transistor of method 1100 includes at least PMOS transistor P10 or P11. In some embodiments, operation 1106c includes causing the first signal to transition from a first logical value (0) to a second logical value (1) in response to a transition of the first bit line signal from the second logical value (1) to the first logical value (0).

In operation 1108 of method 1100, a latch is disabled in response to at least the first pre-charge signal or a first clock signal. In some embodiments, the latch of method 1100 includes at least latch 230. In some embodiments, the first clock signal of method 1100 includes at least clock signal RCLK, RCKB or RCK.

In operation 1110 of method 1100, the state of the first signal is latched by the latch in response to at least the first pre-charge signal or the first clock signal. In some embodiments, the latch of method 1100 includes a first inverter and a second inverter. In some embodiments, the first inverter of method 1100 includes inverter I2 or I3. In some embodiments, the first inverter of method 1100 includes inverter I3 or I2.

In some embodiments, operation 1110 includes at least operation 1112 or 1114.

In operation 1112 of method 1100, the NAND logic gate circuit is disabled in response to at least the first pre-charge signal. In some embodiments, operation 1112 includes the NAND logic gate circuit being disabled after time T8 in response to the first pre-charge signal transitioning to a low logical value.

In operation 1114 of method 1100, the second inverter is enabled in response to at least the first pre-charge signal or the first clock signal. In some embodiments, operation 1114 includes the second inverter being enabled in response to the first pre-charge signal transitioning to a low logical value (e.g., after time T8). In some embodiments, operation 1114 includes the second inverter being enabled in response to the first clock signal transitioning to a low logical value (e.g., after time T8).

By operating method 1100, the memory circuit operates to achieve the benefits discussed above with respect to memory circuit 100-1000. While method 1100 was described above with reference to FIGS. 2-5, it is understood that method 1100 utilizes the features of one or more of FIGS. 6-10.

In some embodiments, one or more of the operations of method 1100 is not performed. Furthermore, various PMOS or NMOS transistors shown in FIGS. 2-10 are of a particular dopant type (e.g., N-type or P-type) for illustration purposes. Embodiments of the disclosure are not limited to a particular transistor type, and one or more of the PMOS or NMOS transistors shown in FIGS. 2-10 can be substituted with a corresponding transistor of a different transistor/dopant type. Similarly, the low or high logical value of various signals used in the above description is also for illustration. Embodiments of the disclosure are not limited to a particular logical value when a signal is activated and/or deactivated. Selecting different logical values is within the scope of various embodiments. Selecting different numbers of inverters in FIGS. 2-10 is within the scope of various embodiments. Selecting different numbers of transistors in FIG. 2-10 is within the scope of various embodiments. Selecting different numbers of NAND logic gates in FIG. 2-10 is within the scope of various embodiments.

It will be readily seen by one of ordinary skill in the art that one or more of the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

One aspect of this description relates to a memory circuit. A memory circuit includes a NAND logic gate configured to receive a first bit line signal and a second bit line signal, and to generate a first signal. In some embodiments, the memory circuit further includes a first P-type transistor coupled to the NAND logic gate, and configured to receive a first clock signal. In some embodiments, the memory circuit further includes a first N-type transistor coupled to the NAND logic gate, and configured to receive a first pre-charge signal. In some embodiments, the memory circuit further includes a first latch coupled to the NAND logic gate, and configured to latch the first signal in response to at least the first clock signal or the first pre-charge signal.

Another aspect of this description relates to a memory circuit. In some embodiments, the memory circuit includes a NAND logic gate configured to receive a first bit line signal and a second bit line signal, and to generate a first signal responsive to the first bit line signal and the second bit line signal. In some embodiments, the memory circuit further includes a first P-type transistor coupled to the NAND logic gate, and configured to receive a first clock signal. In some embodiments, the memory circuit further includes a first N-type transistor having a first drain coupled to a first voltage supply node of the NAND logic gate, a first gate configured to receive a first input signal, and a first source coupled to a first node. In some embodiments, the memory circuit further includes a second N-type transistor having a second drain coupled to the first source and the first node, a second gate configured to receive a second clock signal inverted from the first clock signal, and a second source coupled to a reference voltage supply. In some embodiments, the memory circuit further includes a first latch coupled to the NAND logic gate by a second node, and configured to latch the first signal in response to at least the first input signal.

Still another aspect of this description relates to a method of operating a memory circuit. The method includes receiving, by a NAND logic gate circuit, a first bit line signal and a second bit line signal and generating, by the NAND logic gate circuit, a first signal in response to the first bit line signal and the second bit line signal. In some embodiments, generating the first signal includes enabling the NAND logic gate circuit in response to a first clock signal and at least a first pre-charge signal or a second pre-charge signal different from the first pre-charge signal. In some embodiments, the method further includes latching, by a latch, a state of the first signal in response to the first clock signal or at least the first pre-charge signal and the second pre-charge signal, the latch including a first inverter and a second inverter.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory circuit, comprising:
   a NAND logic gate configured to receive a first bit line signal and a second bit line signal, and to generate a first signal;
   a first P-type transistor coupled to the NAND logic gate, and configured to receive a first clock signal;
   a first N-type transistor coupled to the NAND logic gate, and configured to receive a first pre-charge signal; and
   a first latch coupled to the NAND logic gate, and configured to latch the first signal in response to at least the first clock signal or the first pre-charge signal.

2. The memory circuit of claim 1, further comprising:
   a second N-type transistor including a gate terminal, a drain terminal and a source terminal, the gate terminal of the second N-type transistor being configured to receive a second pre-charge signal different from the first pre-charge signal, the drain terminal of the second N-type transistor coupled with a first node, the NAND logic gate and the first N-type transistor; and the source terminal of the second N-type transistor being coupled with a second node and the first N-type transistor.

3. The memory circuit of claim 2, wherein the first N-type transistor comprises:
   a gate terminal of the first N-type transistor configured to receive the first pre-charge signal;
   a drain terminal of the first N-type transistor coupled with the first node, the drain terminal of the second N-type transistor and the NAND logic gate; and
   a source terminal of the first N-type transistor coupled with the second node and the source terminal of the second N-type transistor.

4. The memory circuit of claim 3, further comprising:
   a third N-type transistor coupled to the second node, the first N-type transistor, the second N-type transistor and a reference voltage supply, and configured to receive a second clock signal inverted from the first clock signal, the third N-type transistor including:
   a gate terminal of the third N-type transistor configured to receive the second clock signal;
   a drain terminal of the third N-type transistor coupled with the source terminal of the first N-type transistor, the source terminal of the second N-type transistor and the second node; and
   a source terminal of the third N-type transistor coupled with the reference voltage supply.

5. The memory circuit of claim 1, wherein the first P-type transistor includes:
   a gate terminal of the first P-type transistor is configured to receive the first clock signal;
   a source terminal of the first P-type transistor coupled to a voltage supply; and
   a drain terminal of the first P-type transistor is coupled with the NAND logic gate.

6. The memory circuit of claim 1, wherein the first latch comprises:
   a first inverter having an input terminal and an output terminal,
      the input terminal of the first inverter being configured to receive the first signal, and being coupled to an output of the NAND logic gate and a first node; and
      the output terminal of the first inverter being configured to output a second signal inverted from the first signal.

7. The memory circuit of claim 6, wherein the first latch further comprises:
   a second P-type transistor including a gate terminal, a drain terminal and a source terminal, the gate terminal of the second P-type transistor being coupled to the output terminal of the first inverter, and being configured to receive the second signal, the source terminal of the second P-type transistor coupled with a first voltage supply node, and the drain terminal of the second P-type transistor coupled with at least the first node and the NAND logic gate; and
   a second N-type transistor including a gate terminal, a drain terminal and a source terminal, the gate terminal of the second N-type transistor being configured to receive the second signal, and being coupled to the gate terminal of the second P-type transistor and the output terminal of the first inverter, the source terminal of the second N-type transistor is coupled with a second voltage supply node, and the drain terminal of the second N-type transistor is coupled with the drain terminal of the second P-type transistor, the first node and the NAND logic gate.

8. The memory circuit of claim 7, wherein the first latch further comprises:
   a third N-type transistor including a gate terminal, a drain terminal and a source terminal, the gate terminal of the third N-type transistor configured to receive an inverted second pre-charge signal, the inverted second pre-charge signal being inverted from a second pre-charge signal, and the source terminal of the third N-type transistor coupled with a reference voltage supply; and
   a fourth N-type transistor including a gate terminal, a drain terminal and a source terminal, the gate terminal of the fourth N-type transistor being configured to receive an inverted first pre-charge signal, the inverted first pre-charge signal being inverted from the first pre-charge signal, the source terminal of the fourth N-type transistor being coupled with the drain terminal of the third N-type transistor, and the drain terminal of the fourth N-type transistor being coupled with the second voltage supply node and the source terminal of the second N-type transistor.

9. The memory circuit of claim 7, wherein the first latch further comprises:
   a third P-type transistor including a gate terminal, a drain terminal and a source terminal, the gate terminal of the third P-type transistor configured to receive a second clock signal inverted from the first clock signal, the source terminal of the third P-type transistor coupled with a first voltage supply different from a reference voltage supply, and the drain terminal of the third P-type transistor coupled with the first voltage supply node and the source terminal of the second P-type transistor; and
   a third N-type transistor including a gate terminal, a drain terminal and a source terminal, the gate terminal of the third N-type transistor configured to receive the first clock signal, the source terminal of the third N-type transistor coupled with the reference voltage supply, and the drain terminal of the third N-type transistor coupled with the second voltage supply node and the source terminal of the second N-type transistor.

10. The memory circuit of claim 7, wherein the first latch further comprises:
    a third P-type transistor including a gate terminal, a drain terminal and a source terminal, the gate terminal of the third P-type transistor configured to receive the first pre-charge signal, and the source terminal of the third P-type transistor coupled with a first voltage supply different from a reference voltage supply; and
    a fourth P-type transistor including a gate terminal, a drain terminal and a source terminal, the gate terminal of the fourth P-type transistor configured to receive a second pre-charge signal different from the first pre-charge signal, the source terminal of the fourth P-type transistor coupled with the drain terminal of the third P-type transistor, and the drain terminal of the fourth P-type transistor coupled with the first voltage supply node and the source terminal of the second P-type transistor.

11. The memory circuit of claim 1, wherein the NAND logic gate comprises:
    a first input terminal of the NAND logic gate configured to receive the first bit line signal;
    a second input terminal of the NAND logic gate configured to receive the second bit line signal;

an output terminal of the NAND logic gate being configured to output the first signal responsive to the first bit line signal and the second bit line signal;
a first voltage supply node coupled to the first P-type transistor; and
a second voltage supply node coupled to the first N-type transistor.

12. A memory circuit, comprising:
a NAND logic gate configured to receive a first bit line signal and a second bit line signal, and to generate a first signal responsive to the first bit line signal and the second bit line signal;
a first P-type transistor coupled to the NAND logic gate, and configured to receive a first clock signal;
a first N-type transistor having a first drain coupled to a first voltage supply node of the NAND logic gate, a first gate configured to receive a first input signal, and a first source coupled to a first node;
a second N-type transistor having a second drain coupled to the first source and the first node, a second gate configured to receive a second clock signal inverted from the first clock signal, and a second source coupled to a reference voltage supply; and
a first latch coupled to the NAND logic gate by a second node, and configured to latch the first signal in response to at least the first input signal.

13. The memory circuit of claim 12, wherein the first latch comprises:
a first inverter having an input terminal and an output terminal,
the input terminal of the first inverter being configured to receive the first signal, and
being coupled to an output of the NAND logic gate and the second node; and
the output terminal of the first inverter being configured to output a second signal inverted from the first signal.

14. The memory circuit of claim 13, wherein the first latch further comprises:
a second P-type transistor having a third gate configured to receive the second signal, and being coupled to at least the output terminal of the first inverter, a third source coupled with a second voltage supply node, and a third drain coupled with at least the second node; and
a third N-type transistor having a fourth gate configured to receive the second signal, and being coupled to the third gate and the output terminal of the first inverter, a fourth source coupled with a third voltage supply node, and a fourth drain coupled with the third drain and the second node.

15. The memory circuit of claim 14, wherein the first latch further comprises:
a third P-type transistor having a fifth gate configured to receive a first pre-charge signal, a fifth source coupled with a first voltage supply, and a fifth drain; and
a fourth P-type transistor having a sixth gate configured to receive a second pre-charge signal, a sixth source coupled with the fifth drain, and a sixth drain coupled with the second voltage supply node and the third source.

16. The memory circuit of claim 15, wherein the first latch further comprises:

a fourth N-type transistor having a seventh gate configured to receive an inverted second pre-charge signal inverted from the second pre-charge signal, a seventh source coupled with the reference voltage supply, and a seventh drain; and
a fifth N-type transistor having an eighth gate configured to receive an inverted first pre-charge signal inverted from the first pre-charge signal, an eighth source coupled with the seventh drain, and an eighth drain coupled with the third voltage supply node and the fourth source.

17. The memory circuit of claim 14, wherein the first latch further comprises:
a third P-type transistor having a fifth gate configured to receive the second clock signal, a fifth source coupled with a first voltage supply, and a fifth drain coupled with the second voltage supply node and the third source; and
a fourth N-type transistor having a sixth gate configured to receive the first clock signal, a sixth source coupled with the reference voltage supply, and a sixth drain coupled with the third voltage supply node and the fourth source.

18. The memory circuit of claim 12, wherein the first P-type transistor includes:
a third gate configured to receive the first clock signal;
a third source coupled to a first voltage supply different from the reference voltage supply; and
a third drain is coupled to a second voltage supply node of the NAND logic gate.

19. A method of operating a memory circuit, the method comprising:
receiving, by a NAND logic gate circuit, a first bit line signal and a second bit line signal;
generating, by the NAND logic gate circuit, a first signal in response to the first bit line signal and the second bit line signal, wherein generating the first signal comprises:
enabling the NAND logic gate circuit in response to a first clock signal and at least a first pre-charge signal or a second pre-charge signal different from the first pre-charge signal; and
latching, by a latch, a state of the first signal in response to the first clock signal or at least the first pre-charge signal or the second pre-charge signal, the latch including a first inverter and a second inverter.

20. The method of claim 19, wherein
enabling the NAND logic gate circuit in response to the first clock signal and at least the first pre-charge signal comprises:
turning on at least a first N-type transistor in response to the first pre-charge signal, the first N-type transistor coupled between the NAND logic gate circuit and a reference supply voltage node; and
latching the state of the first signal in response to the first clock signal or at least the first pre-charge signal or the second pre-charge signal, comprises:
disabling the NAND logic gate circuit in response to at least the first pre-charge signal; and
enabling the second inverter in response to the first clock signal or at least the first pre-charge signal or the second pre-charge signal.

* * * * *